(12) United States Patent
Cooke et al.

(10) Patent No.: US 12,356,848 B2
(45) Date of Patent: Jul. 8, 2025

(54) SOLAR ANTENNA ARRAY FABRICATION

(71) Applicant: NovaSolix, Inc., Newark, CA (US)

(72) Inventors: Laurence H. Cooke, Los Gatos, CA (US); Paul Comita, Menlo Park, CA (US); Robert E. Cousins, Saratoga, CA (US); Albert K. Henning, Palo Alto, CA (US); Andreas Hegedus, Burlingame, CA (US); David B. Cooke, Los Gatos, CA (US); Yao Te Cheng, Sunnyvale, CA (US); John Burke, Danville, CA (US); Richard T. Preston, Woodside, CA (US)

(73) Assignee: NOVASOLIX, INC., Newark, CA (US)

( * ) Notice: Subject to any disclaimer, the term of this patent is extended or adjusted under 35 U.S.C. 154(b) by 0 days.

(21) Appl. No.: 18/516,427

(22) Filed: Nov. 21, 2023

(65) Prior Publication Data

US 2024/0097346 A1    Mar. 21, 2024

Related U.S. Application Data

(63) Continuation of application No. 17/748,988, filed on May 19, 2022, now Pat. No. 11,824,264, which is a
(Continued)

(51) Int. Cl.
*H10K 85/20*    (2023.01)
*H01Q 1/22*    (2006.01)
(Continued)

(52) U.S. Cl.
CPC .......... *H10K 85/221* (2023.02); *H01Q 1/2283* (2013.01); *H01Q 1/422* (2013.01); *H01Q 21/0087* (2013.01); *H10K 39/10* (2023.02)

(58) Field of Classification Search
CPC ...... H01Q 21/00; H01Q 21/0087; H01Q 1/00; H01Q 1/2283; H01Q 1/422; H10K 39/10; H10K 85/221
See application file for complete search history.

(56) References Cited

U.S. PATENT DOCUMENTS 5,043,739 A    8/1991   Logan et al.
7,354,877 B2   4/2008   Rosenberger et al.
(Continued)

FOREIGN PATENT DOCUMENTS

CN    102171811 A    8/2011
FR    2996681 A1     4/2014
(Continued)

OTHER PUBLICATIONS

Kumar, B., Kaushik, B.K. & Negi, Y.S. Perspectives and challenges for organic thin film transistors: materials, devices, processes and applications. J Mater Sci: Mater Electron 25, 1-30 (2014). https://doi.org/10.1007/s10854-013-1550-2 (Year: 2014).*
(Continued)

*Primary Examiner* — Mayla Gonzalez Ramos
(74) *Attorney, Agent, or Firm* — Panitch Schwarze Belisario & Nadel LLP

(57) ABSTRACT

Methods for constructing multi-walled carbon nanotube (MWCNT) antenna arrays, may include: variable doping of the MWCNTs, forming light pipes with layers of variable dielectric glass, forming geometric diodes on full-wave rectified devices that propagate both electrons and holes, using clear conductive ground plans to form windows that can control a building's internal temperature, and generating multiple lithographic patterns with a single mask.

5 Claims, 21 Drawing Sheets

Related U.S. Application Data continuation-in-part of application No. 17/348,330, filed on Jun. 15, 2021, now Pat. No. 11,653,509, which is a continuation-in-part of application No. 15/682,646, filed on Aug. 22, 2017, now Pat. No. 11,114,633, which is a continuation-in-part of application No. 15/411,396, filed on Jan. 20, 2017, now Pat. No. 10,580,920, which is a continuation-in-part of application No. 15/249,953, filed on Aug. 29, 2016, now abandoned, which is a continuation-in-part of application No. 15/133,807, filed on Apr. 20, 2016, now abandoned.

(51) Int. Cl.
   *H01Q 1/42* (2006.01)
   *H01Q 21/00* (2006.01)
   *H10K 39/10* (2023.01)

(56) References Cited

U.S. PATENT DOCUMENTS

| | | | |
|---|---|---|---|
| 7,354,977 | B1 | 4/2008 | Woods et al. |
| 7,431,965 | B2 | 10/2008 | Grigorian et al. |
| 7,431,985 | B2 | 10/2008 | Iwama |
| 7,679,057 | B2 | 3/2010 | Gritz et al. |
| 7,679,957 | B2 | 3/2010 | Ma et al. |
| 7,687,160 | B2 | 3/2010 | Winarski |
| 7,744,793 | B2 | 6/2010 | Lemaire et al. |
| 8,137,653 | B1 | 3/2012 | Predtechensky et al. |
| 8,803,340 | B2 | 8/2014 | Moddel |
| 2002/0090331 | A1* | 7/2002 | Smalley .......... B01J 23/755 422/600 |
| 2004/0085247 | A1 | 5/2004 | Mickle et al. |
| 2005/0112049 | A1 | 5/2005 | Hofmeister |
| 2005/0214198 | A1 | 9/2005 | Park et al. |
| 2007/0107103 | A1 | 5/2007 | Kempa et al. |
| 2007/0240757 | A1* | 10/2007 | Ren .......... H01L 31/035227 257/E31.032 |
| 2009/0128893 | A1 | 5/2009 | McCarthy et al. |
| 2009/0308443 | A1* | 12/2009 | Cutler .......... H10K 39/10 136/256 |
| 2010/0084475 | A1 | 4/2010 | Hata et al. |
| 2010/0244656 | A1 | 9/2010 | Ito et al. |
| 2010/0263709 | A1 | 10/2010 | Norman et al. |
| 2010/0284086 | A1 | 11/2010 | Novack et al. |
| 2011/0041900 | A1 | 2/2011 | Park et al. |
| 2011/0121258 | A1* | 5/2011 | Hanein .......... H01Q 9/285 977/950 |
| 2011/0163920 | A1* | 7/2011 | Cutler .......... H01Q 1/248 977/762 |
| 2011/0207328 | A1 | 8/2011 | Speakman |
| 2011/0217451 | A1 | 9/2011 | Veerasamy |
| 2012/0186635 | A1 | 7/2012 | Eastman et al. |
| 2012/0206085 | A1 | 8/2012 | Stevens |
| 2012/0211063 | A1 | 8/2012 | Lee et al. |
| 2013/0249771 | A1* | 9/2013 | Kotter .......... H01Q 1/248 29/601 |
| 2013/0276861 | A1 | 10/2013 | Cooke |
| 2014/0085148 | A1 | 3/2014 | Cutler |
| 2015/0130692 | A1 | 5/2015 | Cooke |
| 2015/0155396 | A1* | 6/2015 | Cooke .......... H02S 40/22 136/244 |
| 2015/0243817 | A1 | 8/2015 | Cooke et al. |
| 2016/0027949 | A1 | 1/2016 | Cooke et al. |
| 2017/0239892 | A1 | 8/2017 | Buller et al. |
| 2017/0309767 | A1 | 10/2017 | Cooke et al. |
| 2018/0026149 | A1 | 1/2018 | Iyer et al. |
| 2018/0210337 | A1 | 7/2018 | Wakita et al. |
| 2020/0219832 | A1* | 7/2020 | Marimuthu .......... H01L 21/568 |
| 2020/0227631 | A1 | 7/2020 | Cola et al. |
| 2020/0295075 | A1 | 9/2020 | Goldstein et al. |
| 2020/0309674 | A1 | 10/2020 | Wardle et al. |
| 2021/0041759 | A1 | 2/2021 | Trikha et al. |
| 2022/0278461 | A1 | 9/2022 | Cooke et al. |

FOREIGN PATENT DOCUMENTS

| | | |
|---|---|---|
| TW | 201110272 A | 3/2011 |
| WO | 2007120175 A2 | 10/2007 |
| WO | 2014063149 A1 | 4/2014 |
| WO | 2017210490 A1 | 12/2017 |

OTHER PUBLICATIONS

Collinear—Definition and More from the Free Merriam-Webster Dictionary, "http://www.merriam-webster.com/dictionary/collinear", 2014.

Rows—Definition and More from the Free Merriam-Webster Dictionary, "http://www.merriam-webster.com/dictionary/rows," 2014.

Siciliano et al., "Nano-Rectenna for High Efficiency Direct Conversion of Sunlight to Electricity," presented at 17th World Micromachine Summit, Apr. 26-29, 2011.

Williams, "Rice's carbon nanotube fibers outperform copper," at "http://news.rice.edu/2014/02/13/rices-carbon-nanotube-fibers-outperform-copper-2," posted Feb. 13, 2014.

Hata, "From Super Growth to DWNT forests, CNT solids, Flexible Transparent CNT films, and Super-Capacitors and Much More," Jun. 19, 2006.

Ma et al., "The production of horizontally aligned single-walled carbon nanotubes," Carbon, 49, pp. 4098-4110, 2011.

Kumar, "Chemical Vapor Deposition of Carbon Nanotubes: A Review on Growth Mechanism and Mass Production," Journal of Nanoscience and Nanotechnology, vol. 10, pp. 3739-3758, 2010.

Office Action issued Feb. 11, 2014 in U.S. Appl. No. 13/454,155.

Office Action issued Jun. 27, 2014 in U.S. Appl. No. 13/454,155.

Office Action issued Sep. 26, 2014 in U.S. Appl. No. 13/454,155.

Office Action issued Jan. 13, 2015 in U.S. Appl. No. 13/454,155.

Type—definition of type by The Free Dictionary, downloaded from web page: http://www.thefreedictionary.com/type, Download date: Mar. 9, 2015, original posting date: unknown, 1 page.

Office Action issued Mar. 17, 2015 in U.S. Appl. No. 13/454,155.

Int'l Search Report and Written Opinion issued Apr. 8, 2016 in Int'l Application No. PCT/US15/59852.

Int'l Search Report and Written Opinion issued Aug. 11, 2016 in Int'l Application No. PCT/US16/29336.

Office Action issued Nov. 14, 2016 in U.S. Appl. No. 14/582,747, by Cooke.

Office Action issued Dec. 29, 2016 in U.S. Appl. No. 15/133,807, by Gonzalez Ramos.

Office Action issued Apr. 5, 2017 in U.S. Appl. No. 14/582,747 by Cooke.

Office Action issued May 4, 2017 in U.S. Appl. No. 15/249,953, by Cooke.

Office Action issued Apr. 20, 2017 in U.S. Appl. No. 14/871,958, by Cooke.

Office Action issued Mar. 7, 2017 in U.S. Appl. No. 14/701,765, by Cooke.

Int'l Search Report and Written Opinion issued Jun. 20, 2017 in Int'l Application No. PCT/US2017/026130.

Office Action issued Jun. 8, 2017 in U.S. Appl. No. 14/701,765, by Cooke.

Int'l Preliminary Report issued Jul. 6, 2017 in PCT Application No. PCT/US2015/059852.

Office Action issued Jul. 3, 2017 in U.S. Appl. No. 15/133,807, by Cooke.

Office Action issued Jul. 27, 2017 in U.S. Appl. No. 15/411,396, by Cooke.

Office Action issued Sep. 22, 2017 in U.S. Appl. No. 13/454,155, by Cooke.

Int'l Preliminary Report on Patentability issued Nov. 16, 2017 in Int'l Application No. PCT/US2016/029336.

Office Action issued Jan. 11, 2018 in U.S. Appl. No. 15/249,953, by Cooke.

Office Action issued Feb. 27, 2018 in U.S. Appl. No. 15/411,396, by Cooke.

Office Action issued Mar. 9, 2018 in U.S. Appl. No. 15/133,807, by Cooke.

(56) References Cited

OTHER PUBLICATIONS

Office Action issued May 29, 2018 in CN Application No. 201580071231.4.
Extended European Search Report issued Sep. 7, 2018 in EP Application No. 15873906.0.
Extended European Search Report issued Oct. 15, 2018 in EP Application No. 16789760.2.
Office Action issued Sep. 18, 2018 in CN Application No. 201680025443.3.
Office Action issued May 5, 2019 in CN Application No. 201580071231.4.
Office Action issued May 31, 2019 in U.S. Appl. No. 15/661,854.
Office Action issued Apr. 4, 2019 in U.S. Appl. No. 15/411,396.
Search Report issued Jul. 8, 2019 in TW Application No. 104137565.
Zhu et al., "Graphene geometric diodes for terahertz rectennas" Journal of Physics D, 46, 6 pages, 2013.
Wilhite et al., "Metal–nan Contacts", Semiconductor Science and Technology, 29, 16 pages, 2014.
Office Action mailed Jul. 11, 2022 in U.S. Appl. No. 17/348,330, by Iyer.
Notice of Allowance issued Jan. 9, 2023 in U.S. Appl. No. 17/348,330.
Office Action issued Mar. 1, 2023 in CN Application No. 202010368277.5 with English translation.
Office Action issued Mar. 1, 2023 in CN Application No. 202010368277.5.
Int'l Search Report and Written Opinion issued Aug. 1, 2023 in Int'l Application No. PCT/US2023/020401.

\* cited by examiner

SOLAR ANTENNA ARRAY FABRICATION

CROSS-REFERENCE TO RELATED APPLICATIONS

This application is a continuation of U.S. patent application Ser. No. 17/748,988, filed on May 19, 2022, which is a continuation-in-part of U.S. patent application Ser. No. 17/348,330, filed on Jun. 15, 2021, which is a continuation-in-part of U.S. patent application Ser. No. 15/682,646, filed on Aug. 24, 2017, which is a continuation-in-part of U.S. patent application Ser. No. 15/411,396, filed on Jan. 20, 2017, which is a continuation-in-part of U.S. patent application Ser. No. 15/249,953, filed on Aug. 29, 2016, which is a continuation-in-part of U.S. patent application Ser. No. 15/133,807, filed on Apr. 20, 2016, all of which are incorporated herein by reference.

FIELD OF ENDEAVOR

Various aspects of this disclosure may pertain to economical manufacturing processes of visible light rectenna arrays for the conversion of solar energy to electricity.

BACKGROUND

Rectifiers for AC to DC conversion of high frequency signals have been well known for decades. A particular type of diode rectifier when coupled to an antenna, called a rectenna, has also been known for decades. More specifically, over 20 years ago, Logan described using an array of rectennas to capture and convert microwaves into electrical energy in U.S. Pat. No. 5,043,739 granted Aug. 27, 1991. However, the dimensions of the antenna limited the frequency until recently, when Gritz, in U.S. Pat. No. 7,679,957 granted Mar. 16, 2010, described using a similar structure for converting infrared light into electricity, and Pietro Siciliano suggested that such a structure may be used for sunlight in "Nano-Rectenna For High Efficiency Direct Conversion of Sunlight to Electricity," by Pietro Siciliano of The Institute for Microelectronics and Microsystems IMM-CNR, Lecce (Italy).

Still, the minimum dimensions required for such visible light rectennas are generally in the tens of nanometers. While these dimensions may be accomplished by today's deep submicron masking technology, such processing is typically far more expensive than the current solar cell processes, which require much larger dimensions.

Still, as Logan pointed out in U.S. Pat. No. 5,043,739, the efficiency of microwave rectennas can be as high as 40%, more than double that of typical single junction poly-silicon solar cell arrays, and when using metal-oxide-metal (MOM) rectifying diodes, as Pietro suggests, no semiconductor transistors are needed in the array core.

As such, it may be advantageous to be able to utilize the existing fine geometry processing capability of current semiconductor fabrication without incurring the cost of such manufacturing.

Also, recently, Rice University reported that their researchers created a carbon nanotube (CNT) thread with metallic-like electrical and thermal properties. Furthermore, carbon nanotube structures are becoming more manufacturable, as described by Rosenberger et al. in U.S. Pat. No. 7,354,977 granted Apr. 8, 2008. Various forms of continuous CNT growth may have also been contemplated, such as Lemaire et. al. repeatedly harvesting a CNT "forest" while it is growing in U.S. Pat. No. 7,744,793 granted Jun. 29, 2010, and/or put into practice using techniques described by Predtechensky et al. in U.S. Pat. No. 8,137,653 granted Mar. 20, 2012. Grigorian et al. describes continuously pushing a carbon gas through a catalyst backed porous membrane to grow CNTs in U.S. Pat. No. 7,431,985 granted Oct. 7, 2008.

Furthermore, others have contemplated using CNTs for various structures such as Rice University's CNT thread as described in "Rice's carbon nanotube fibers outperform copper," by Mike Williams, posted on Feb. 13, 2014 at: news.rice.edu/2014/02/13/rices-carbon-nanotube-fibers-outperform-copper-2; magnetic data storage as described by Tyson Winarski in U.S. Pat. No. 7,687,160 granted Mar. 30, 2010; or connecting multi-walled CNTs (MWCNTs) to carbonized gold pads for low resistance interconnect in "Metal-nanocarbon contacts" by Patrick Wilhite et al. published in Semicond. Sci. Technol. 29 (2014) 054006 (16pp); and in particular, antenna-based solar cells, as described by Tadashi Ito et al. in US Patent Application Publication 2010/0244656 published Sep. 30, 2010. Still, Ito et al. did not describe methods to inexpensively construct carbon nanotube solar antennas for efficient conversion of solar energy; rather Erik C. Anderson et. al. suggested combining multi-walled CNTs and tunnel diodes to form optical rectennas in "High Performance Multiwall Carbon Nanotube-Insulator-Metal Tunnel Diode Arrays for Optical Rectification" published in 2018 in Advanced Electronic Materials, DOI: 10.1002/aelm.201700446.

Finally, Zixu Zhu et. al. described a terahertz frequency "Geometric Diode" with both hole and electron charge carriers in "Graphene geometric diodes for terahertz rectennas" published 15 Apr. 2013 in J. Phys. D: Appl. Phys. 46 (2013) 185101.

SUMMARY OF VARIOUS EMBODIMENTS

Various aspects of the present disclosure may relate to ways to manufacture structures of MWCNT rectenna arrays for converting sunlight into electricity, which may utilize current IC manufacturing techniques and self-aligning process steps, and which may be successively used to achieve the molecular sized dimensions required for the antennas and the geometric diodes. Other aspects of the present disclosure may relate to ways to operate the MWCNT rectenna array to optimally convert sunlight into electricity.

The structure of the rectenna array may include an array of MWCNT antennas connecting between interdigitated ground lines and negative voltage lines through geometric diodes. The antennas may be of varying lengths and orientations, distributed for maximum reception of substantially the full spectrum of ambient sunlight, e.g., having ¼ wavelengths or harmonic multiples of ¼ wavelengths, where single ¼-wavelength antenna diode combinations may half-wave rectify the received light, and two coupled ¼-wavelength antenna diode combinations may full-wave rectify the received light.

In one aspect, the multi-walled carbon nanotube antennas may be constructed between interdigitated conductive lines alternating from the ground and negative voltage lines by growing from a nickel catalyst on the ground lines to the side walls of the negative voltage lines.

In another aspect, the two coupled ¼-wavelength antennas diode combinations may be connected by multiple direct contacts or intermediate CNT fuzz on a common ground line, to form center ground tapped full-wave rectified antennas.

In another aspect, the two coupled ¼-wavelength antennas diode combinations may be connected by multiple direct contacts on a common insulating material, where the first coupled ¼-wavelength antennas diode combination is connected to a ground line and the second coupled ¼-wavelength antennas diode combination is connected to a negative voltage line, where the diodes are geometric diodes.

In another aspect, the geometric diodes may be electrically biased such that the geometric diodes connected to the ground lines inject holes into the ground lines and geometric diodes connected to the negative voltage lines inject electrons into the negative voltage lines.

In another aspect, the interdigitated ground and negative voltage lines may each be a mix of one or two conductive materials and nickel catalyst on both the negative voltage lines and the ground lines. The negative voltage lines and ground lines may have different mixes of conductive materials and nickel, each of which may be applied with different thicknesses.

In another aspect, the interdigitated conductive lines may be deposited on a sheet of glass, and the space between the interdigitated conductive lines may be filled with a clear insulating material to form a low-k capacitor between the conductive lines and covered with another higher dielectric insulating material followed by a conductive material to form a high-k output capacitor (it is noted that "low-k" and "high-k" are terms of art that refer to a dielectric material (e.g., used in a capacitor) having a relative dielectric constant less than or greater than that of silicon dioxide). The output capacitor may be sufficiently large enough to filter the AC signal on the negative voltage lines.

In another aspect, the nickel may be annealed to selectively form catalytic sites on the ground lines while diffusing at least one of the mix of conductive materials into the nickel on the negative voltage lines, and carbon may be selectively or simultaneously applied to both the ground and negative voltage lines to selectively or simultaneously grow graphene on the negative voltage lines while growing MWCNT antennas from ground lines to the negative voltage lines, where the tips of the MWCNTs form geometric diodes that connect to the graphene on the negative voltage lines with low contact resistance. Selective growth may be performed by using different concentrations and pressures of the applied carbon. The annealing on the catalytic sites may be performed to both control the locations of the catalytic material on the MWCNTs and the diameters of the MWCNTs.

In another aspect, the carbon may vary in concentration with other gasses during a single application, or the isotopes of the carbon may vary in concentration during a single application to increase the probability of injecting electrons or holes through the geometric diodes.

In yet another aspect, manufacturing arrays of MWCNT rectennas may include eliminating some MWCNT shorts between the negative voltage lines and the ground lines by: applying a voltage bias between the negative voltage lines and the ground lines; measuring the temperature with an infrared (IR) camera; determining the hot spots and either: cutting the base of the nearest negative voltage line, cutting the base of the nearest ground line, or locating the shorting MWCNTs within the hot spots using high magnification under regular light and cutting the shorting MWCNTs, where the cutting may be performed using a high intensity laser.

In another aspect, eliminating MWCNT shorts between the negative voltage lines and the ground lines may include applying timed pulses while measuring the ultraviolet (UV) or IR emissions to determine the locations of the shorts, where the pulses are timed to focus the maximum amount of current on each shorting MWCNT based on the locations of the UV or IR emissions.

In another aspect, the conductive material may be clear, to form a window or window covering.

In another aspect, a building, whose air conditioning is powered by windows composed of arrays of ¼-wavelength antenna diode combinations, may control the windows to optimize for both the internal temperature and the light allowed into the building.

In yet another aspect, the glass may be layered with gradually varying dielectric differences to trap light between the glass and the ground plane until absorbed by the MWCNT antennas.

In another process, variable depths of resist may deposited on multiple layers of thin films on the glass, where the resist may be exposed either by variable exposure using lasers or with multiple frequencies of light shining through a single mask containing multiple ¼-wavelength patterns for the frequencies, and processing steps may be performed such that errors due to multiple alignments may be avoided. The mask may be stepped once across the entire surface area being processed with multiple exposures on each step. The resist may be composed of multiple resists, each of which is sensitive to a different frequency of light. Additionally, the laser may also use multiple frequencies of light. The process may then consist of multiple etching steps, including using some of the thin films as additional masks. Following the formation of MWCNT antennas between the ground lines and the negative voltage lines, a combination of clear low-k and high-k dielectric insulators may be deposited to reduce the parallel capacitance across the antennas while increasing the capacitance between the negative voltage lines and an added ground plane.

In yet another process an inert gas may be injected between the glass and added ground plane, with both the negative voltage and ground lines biased to negative voltages to allow the vibration of the MWCNT antennas induced by thermal Brownian motion of the gas hitting the MWCNTs to be rectified into additional power.

BRIEF DESCRIPTION OF THE DRAWINGS

Various aspects of the present disclosure will now be described in connection with the attached drawings, in which.

DESCRIPTION OF VARIOUS ASPECTS OF THE PRESENT DISCLOSURE

Various aspects of the present disclosure are now described with reference to FIG. 1 through FIG. 13, it being appreciated that the figures may illustrate the subject matter of various aspects and may not be to scale or to measure.

Figure 2:
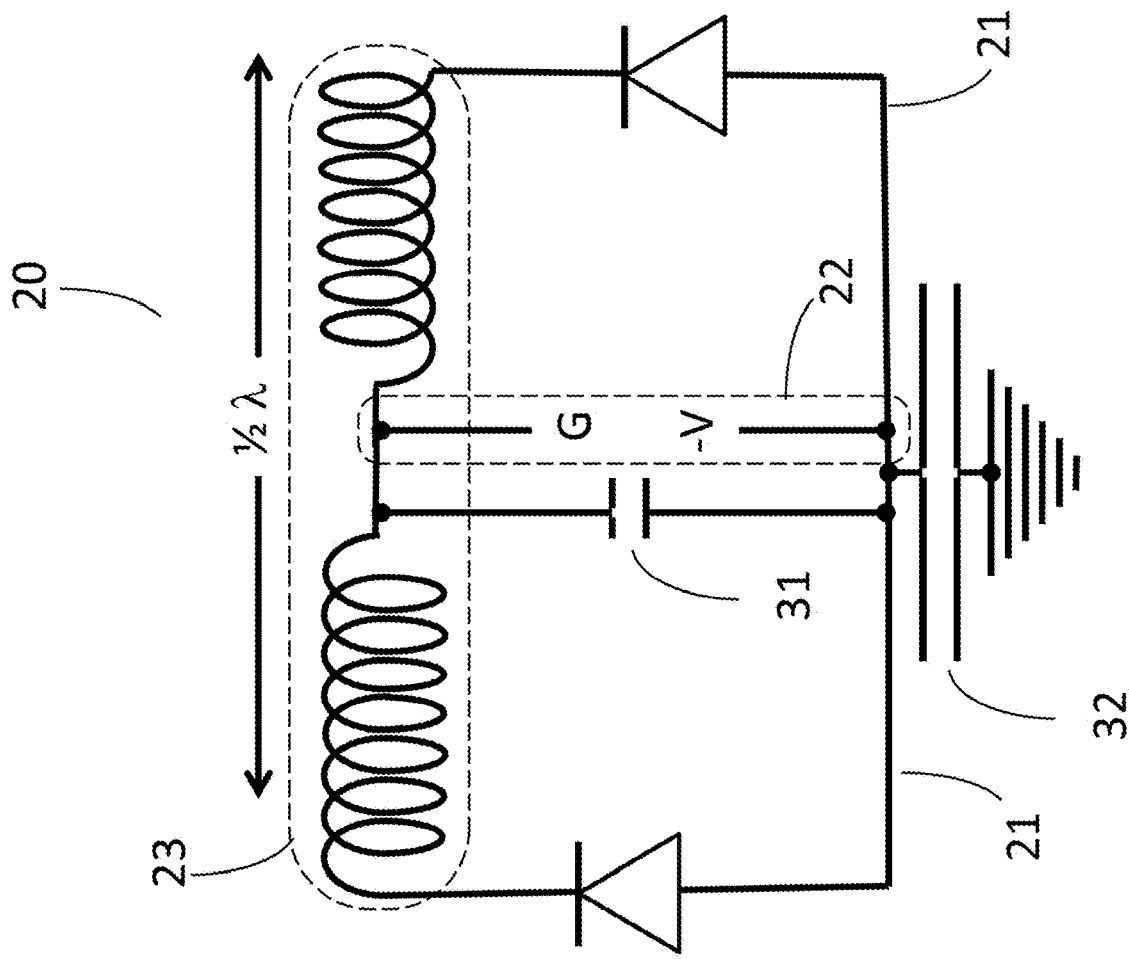
FIG. 2 is another logical diagram of an array of antennas, diodes and coupling capacitors according to an aspect of the present disclosure.
Figure 1:
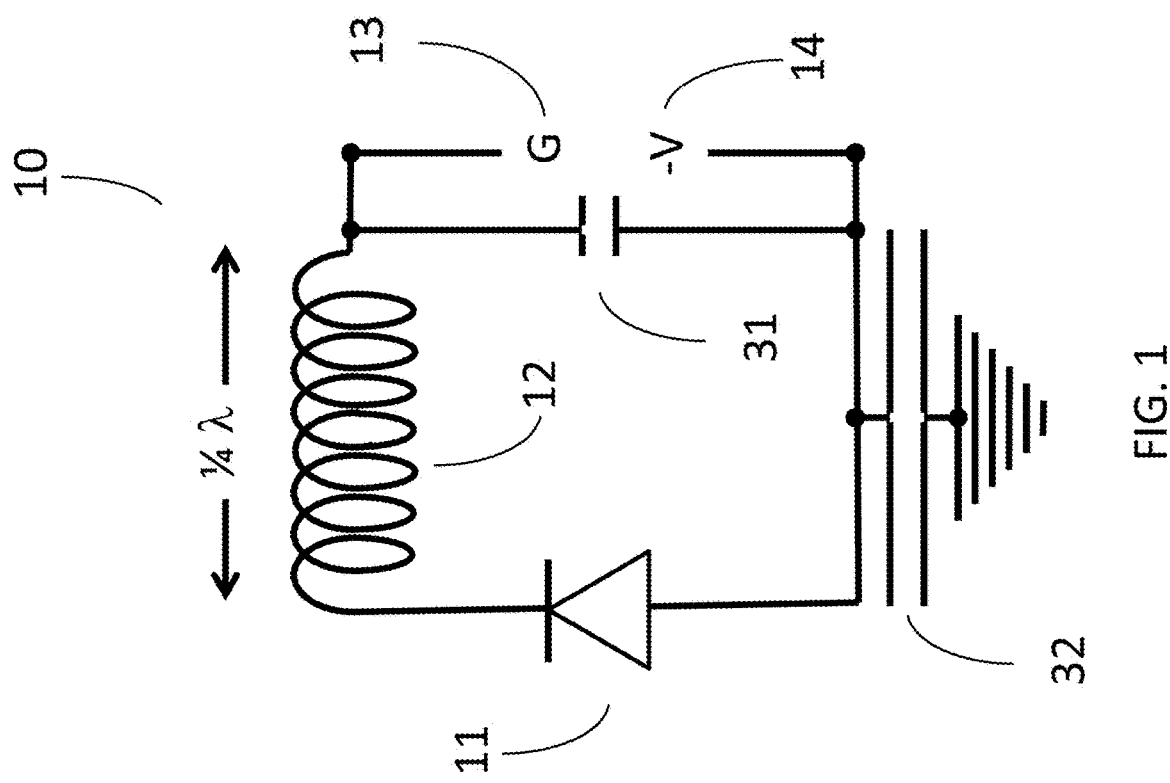
FIG. 1 is a logical diagram of an array of antennas, diodes and coupling capacitors according to an aspect of the present disclosure.

An electrical diagram 10 of a combined diode and antenna according to an aspect of the present disclosure is shown in FIG. 1. A diode 11 and a ¼-wavelength antenna 12 may be coupled together, with the antenna 12 further connected to a ground line 13 and the diode 11 connected to a negative voltage (−V) line 14, to form a ½-wave rectified structure. Another electrical diagram 20 of a pair of diodes and antennas according to another aspect of the present disclosure, is shown in FIG. 2. Two structures 21, each equivalent to the electrical diagram shown in FIG. 1, may together form a pair of antennas 23 that may be coupled to common ground and −V lines 22 to form a full-wave rectified structure.

Figure 3:
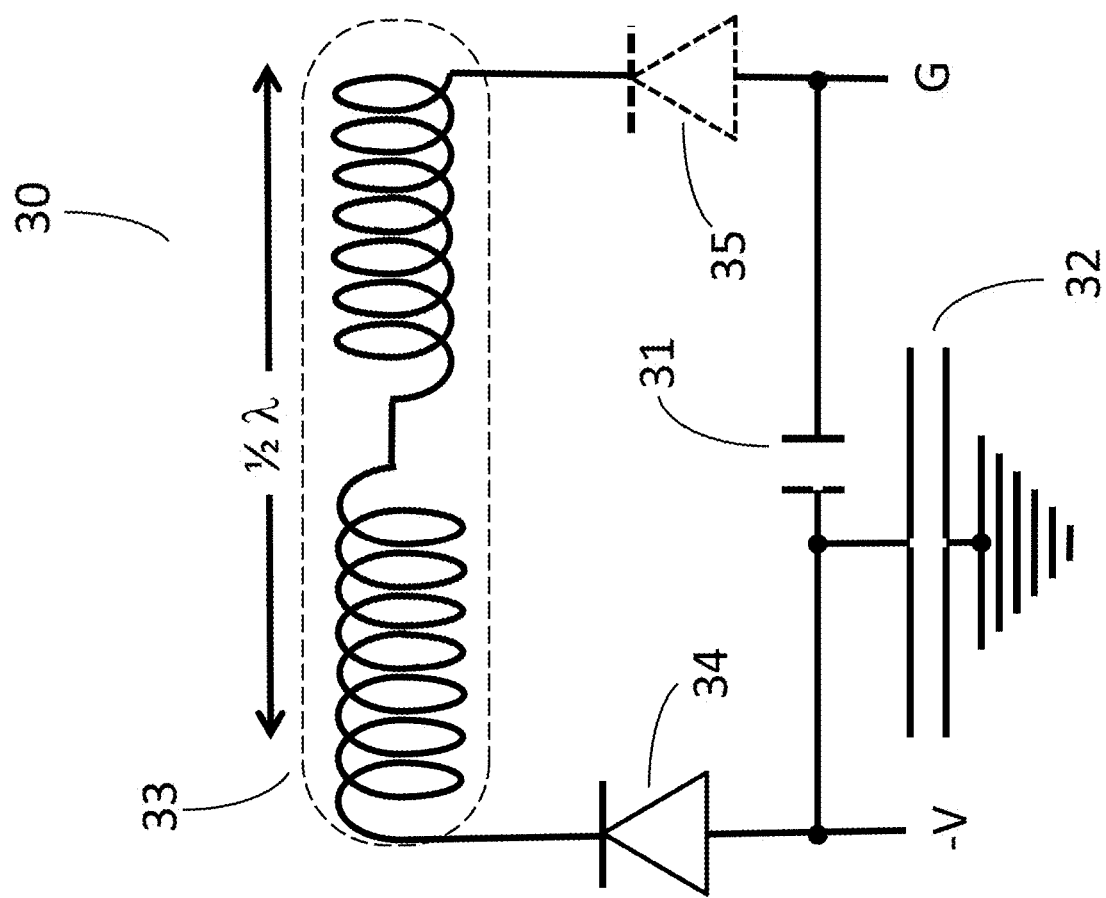
FIG. 3 is another logical diagram of an array of antennas, coupling capacitors, and diodes with both electron and hole charge carriers according to an aspect of the present disclosure.

Reference is now made to FIG. 3, a conceptual diagram of an array of antennas and diodes according to an aspect of the present disclosure. In FIG. 1, the antenna 12 and diode 11 may be respectively connected to the ground line 13 and the power line 14; similar connections may be found in FIG. 3. In this case the physical structure of the power and ground lines 13,14 forms a parallel capacitor 31 between them. Regardless of its size, at the frequencies of visible light, the impedance of the parallel capacitor 31 may be extremely small, which may drain much of the AC power away from the circuit. A much larger output capacitor 32 connected to the output of the diode 11, may significantly reduce this loss, by converting the AC power to DC power. The pair of antennas 33 are not connected to ground. Rather one diode 34, which conducts electrons, is connected to −V, and the other diode 35, which conducts holes, is connected to ground. In this manner, when the photons are absorbed by the antennas, the current flows from −V to ground through both diodes.

Figure 4A:
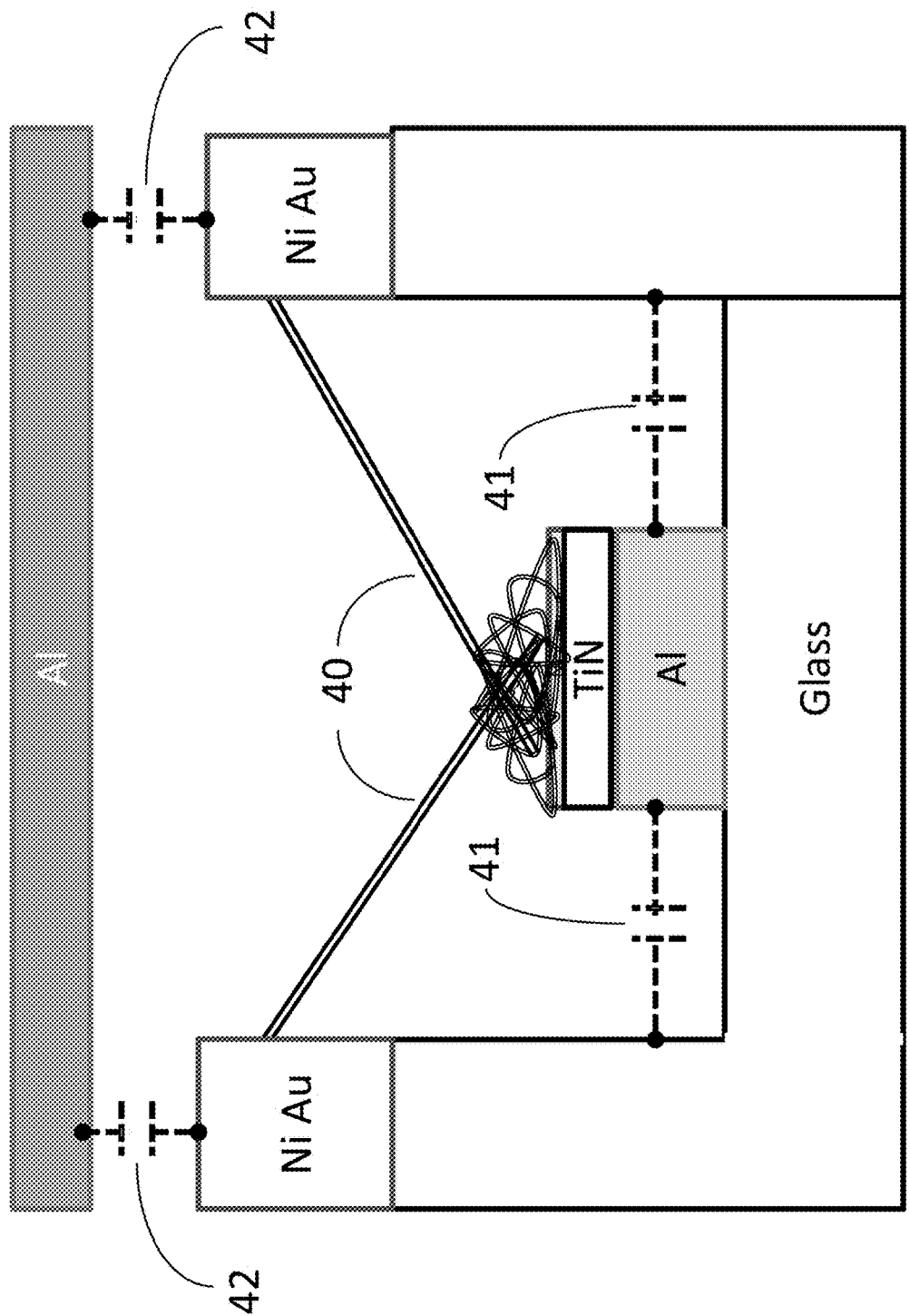
FIGS. 4a and 4b are conceptual diagrams of cross-sections of an antenna array depicting multiple carbon coupled nanotube antennas on a conductor and insulation according to aspects of the present disclosure.

Reference is now made to FIG. 4a, a cross-section of a pair of diodes and antennas according to another aspect of the present disclosure, which may include a pair of MWCNT antennas 40, equivalent to antennas 23 as shown in FIG. 2, with the addition of parallel capacitors 41 connected between power and ground lines and output capacitors 42 connected between the output and ground in a manner similar to capacitors 31 and 32 in FIG. 2.

Figure 4B:
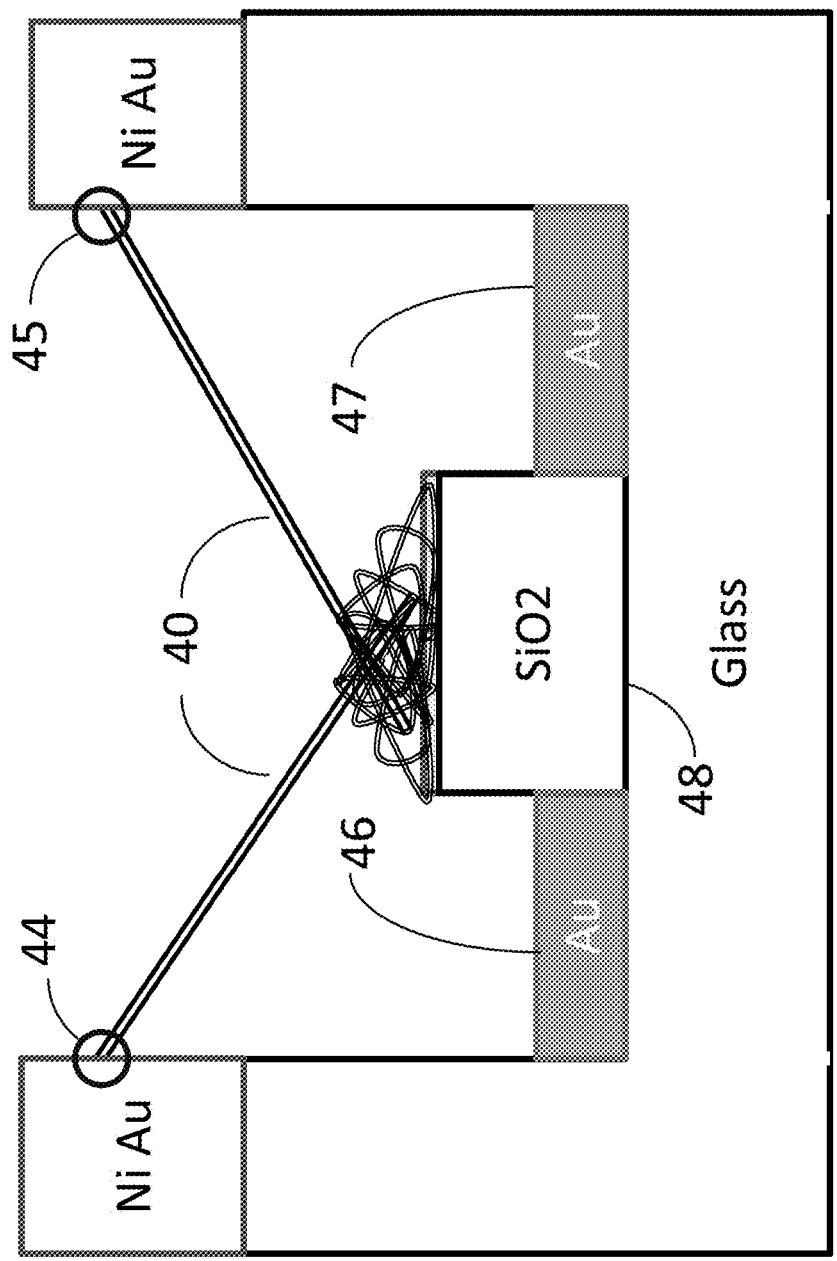

Reference is now made to FIG. 4b, another cross-section of a pair of diodes and MWCNT antennas according to another aspect of the present disclosure, which may be electrically equivalent to FIG. 3. In this case the pair of antennas 40, equivalent to 33 in FIG. 3, are not connected to ground, as shown by their connection to an insulator (SiO$_2$) 48; rather they may be connected to diodes 44 and 45, which may be equivalent to diodes 34 and 35 in FIG. 3. This may be accomplished by applying opposite voltages on the associated conductors 46 and 47 adjacent to the respective diodes 44 and 45, which may thus allow the diode 44 to rectify electrons while the diode 45 rectifies holes.

Figure 5:
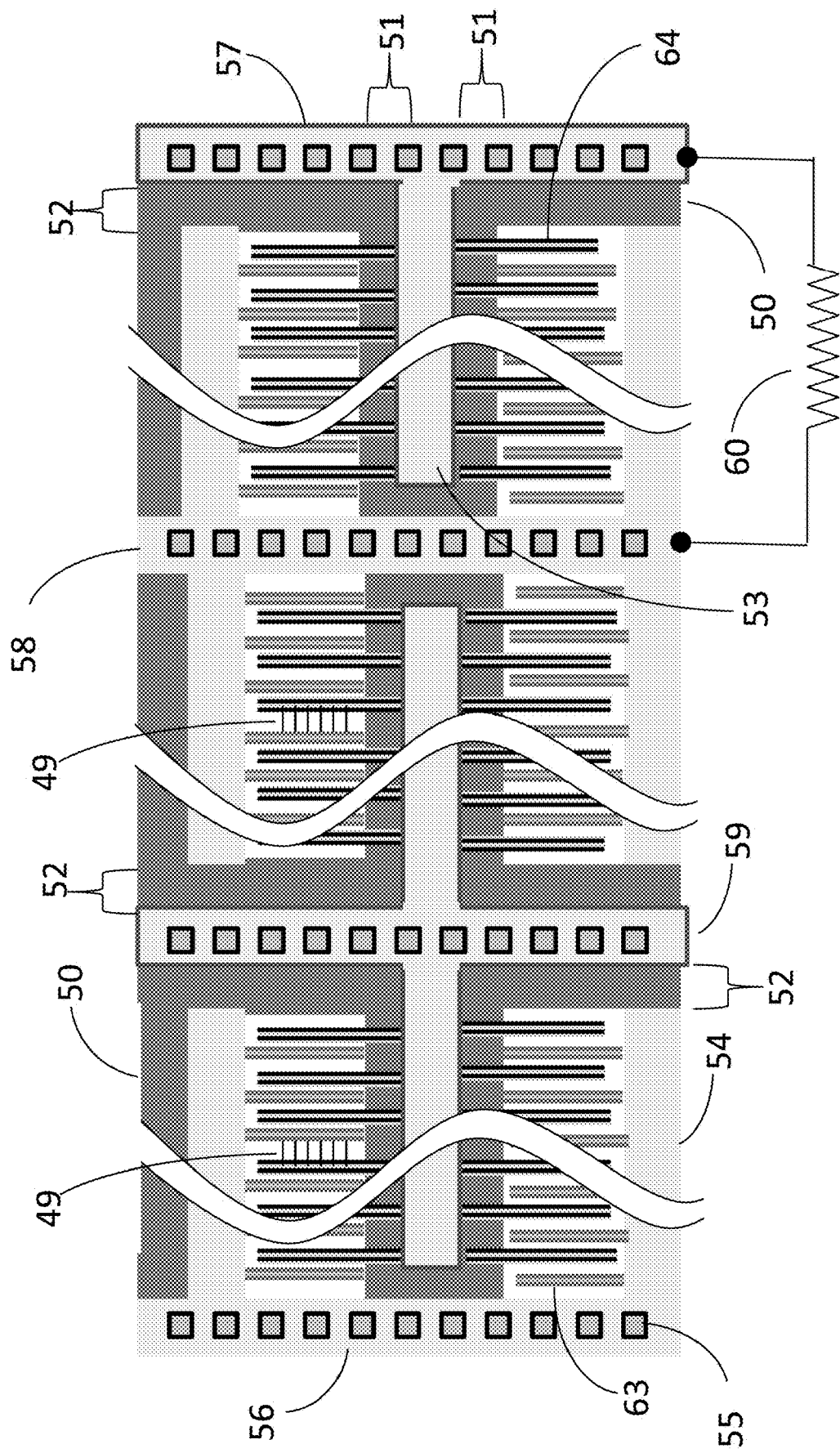
FIG. 5 and FIG. 6 are top views of sections of an antenna array during processing the top metal layers, according to aspects of the present disclosure.

Reference is now made to FIG. 5, a top view of a section of an antenna array, according to an aspect of the present disclosure. FIG. 5 shows the section of antenna array including ground lines 54, a voltage line 53, and self-aligned resist 50 separating voltage and ground areas in a serpentine fashion. At the sides of the glass plate, perpendicular ground and voltage bus lines 56,57 may be formed. Additionally, perpendicular intermediate ground and voltage bus lines 58,59 may also be formed periodically along the glass plate. The intermediate bus lines 58,59 may be adjusted at their ends to connect the voltage bus line 53 to the right perpendicular bus line 57 and the ground bus lines 54 to the left perpendicular bus line 56.

A polarizing grate may transmit light whose wavelength may be larger than the grate's spacing, when the light may be polarized perpendicular to the grate. A polarizing grate may reflect light of the same wavelength, when the light may be polarized parallel to the direction of the lines in the grate. By shining light up through the glass that may be polarized in a direction that is perpendicular to the direction of the negative voltage and ground fingers 64,63, and where the light may have a longer wavelength than the spacing between the negative voltage and ground fingers 64,63, the resist over the gaps 51 and the ends of the rows of fingers 52 between the perpendicular bus lines 56 and 57 and the bus lines 53 and 54 may be exposed. Alternatively, non-polarized light may be used, which may be partially absorbed by the carbon nanotube antennas 49 spanning between the voltage and ground fingers 64,63, when the left and right perpendicular bus lines 56 and 57 may be electrically connected through a resistor 60, which may remove some of the light shining through the glass, leaving all the light to shine through the area not connected with carbon nanotube antennas, thereby exposing the resist 50. Washing away the unexposed resist may leave the resist 50, which may then be cured, and which may thereby form a continuous serpentine separation between the power 54 and ground 53 bus lines. Laser scribing may then be used to form vias 55 through an insulating layer above the fingers and bus lines. Optionally, an additional spray may be applied before laser scribing to enhance the scribing of the vias 55.

Figure 6:
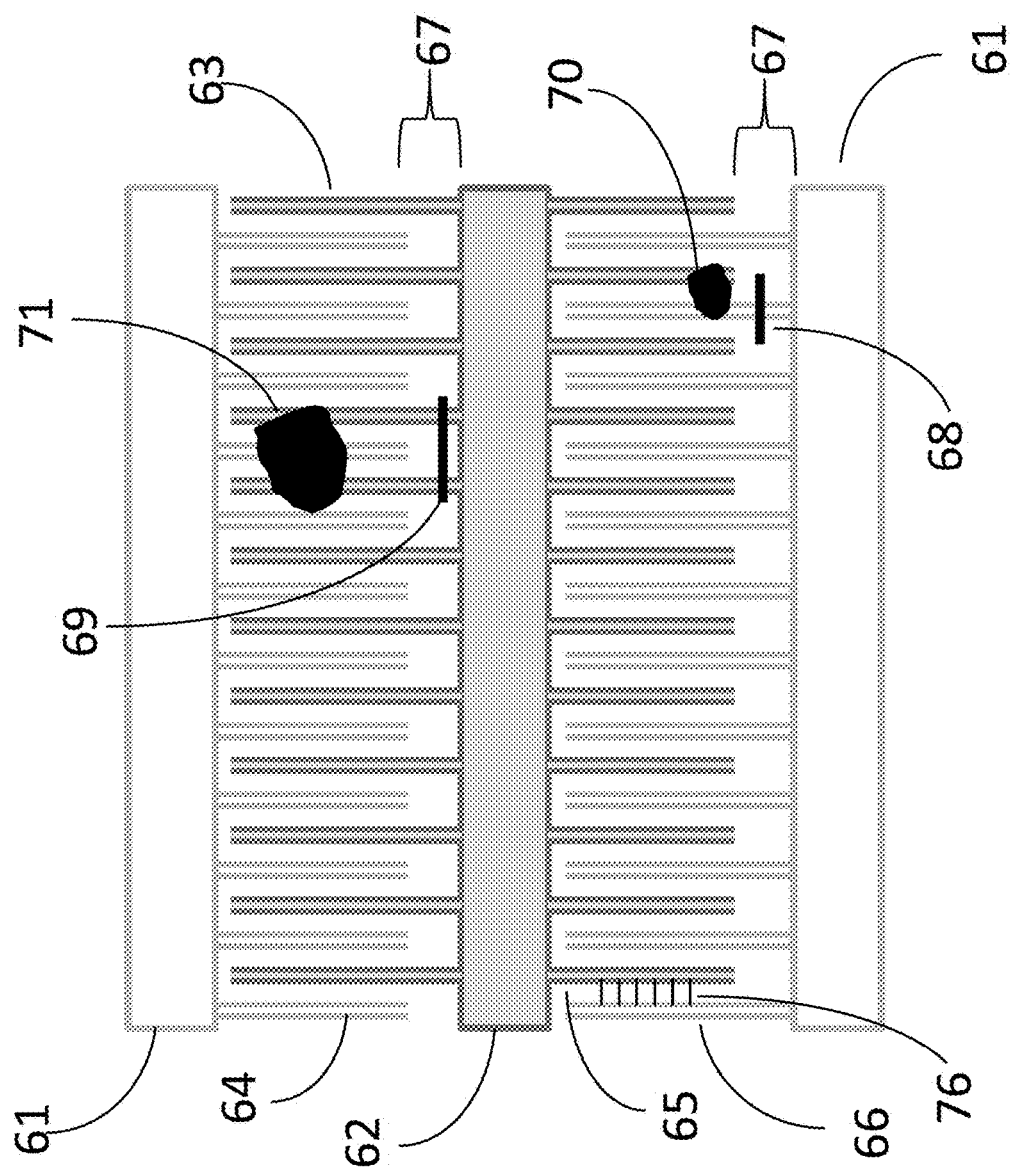

Reference is now made to FIG. 6, a diagram of a top view of a section of an array of antennas according to an aspect of the present disclosure. This structure may include large power 61 and ground 62 bus lines, with interleaved smaller power 64 and ground 63 fingers, with the MWCNT antennas 76 spanning between adjacent power 66 and ground 65 fingers. For the MWCNTs grown between the fingers to vary up to a ½ micron, the space between the fingers may be at least a micron, and to maximize the MWCNT light absorption area, the fingers may be as narrow as may be economically manufactured. Gaps 67 between the ends of the power fingers 64 and the ground bus line 62 and alternatively between the ends of the ground fingers 63 and the power bus line 61 may be sufficiently large enough to allow laser cutting one finger 68 or multiple fingers 69 to cut out the fingers shorted by physical defects 70 and 71.

Figure 7:
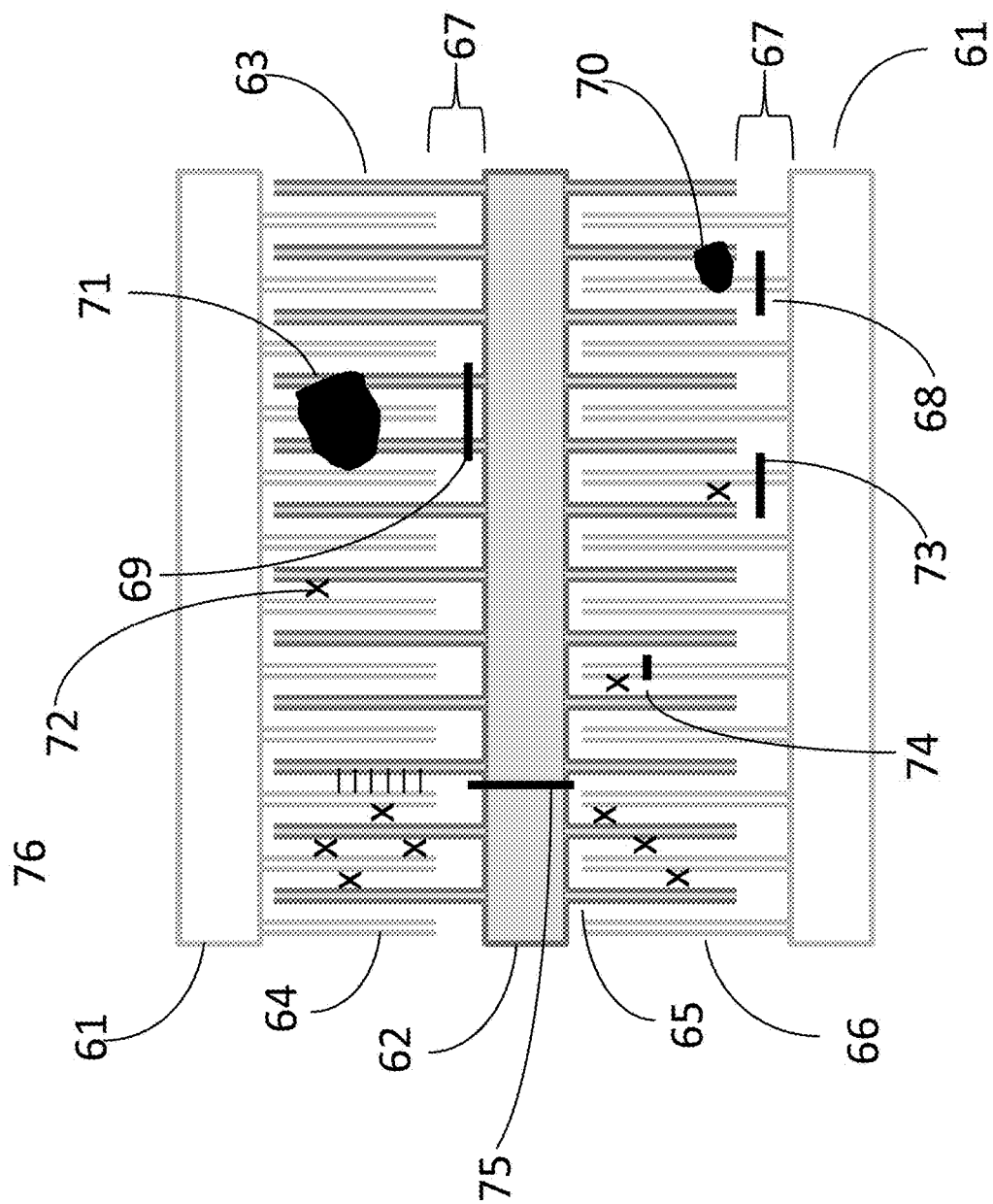
FIG. 7 is a top view of a section of an antenna array showing four types of cuts to eliminate shorts, according to aspects of the present disclosure.

Reference is now made to FIG. 7, another diagram of a top view of a section of an array of antennas according to another aspect of the present disclosure. MWCNT antennas may also cause shorts between the power and ground fingers. Such shorts are depicted as Xs in FIG. 7. If one uses a laser with a sufficiently small spot, individual shorting MWCNTs 72 may be cut. Alternatively, a specific power or ground finger may be cut 74, in a manner similar to the cut 68, to eliminate a physical short. Given a laser with a spot size smaller than the repeating pitch of the power and ground fingers, a portion of a power or ground finger may be cut 74 to eliminate only the shorted area of the finger. Finally, if a sufficiently large enough group of shorts exist, a portion of a bus line may be cut 75 to disconnect the entire group of shorts.

Figure 8:
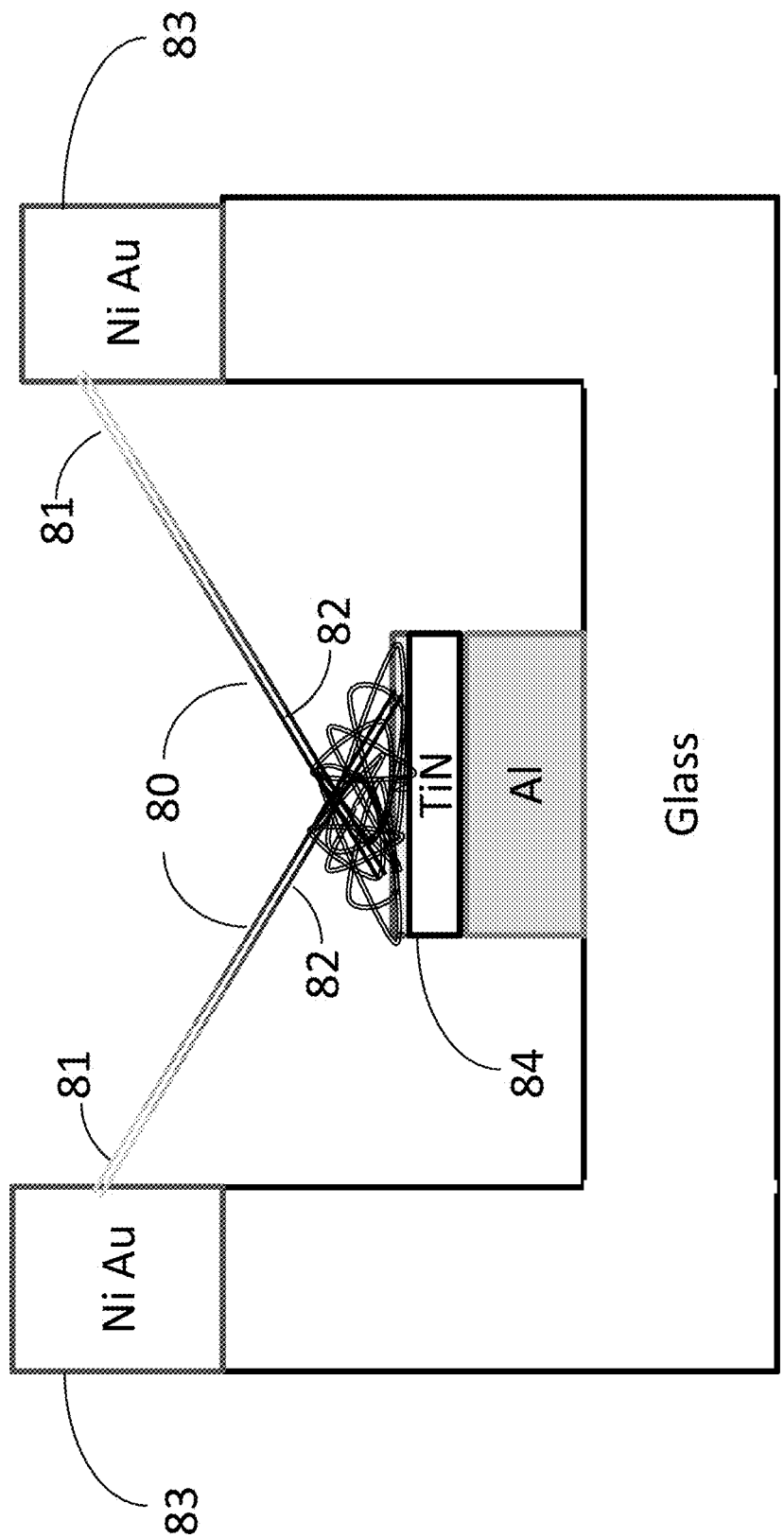
FIG. 8 is a conceptual cross-section of antenna arrays depicting multiple diode and carbon nanotube antennas according to other aspects of the present disclosure.

Reference is now made to FIG. 8, a cross-section of antenna arrays similar to FIG. 4a, which may depict multiple diode and carbon nanotube antennas 80 according to other aspects of the present disclosure. Non-uniform MWCNTs 80 may be grown from the ground finger 84 to the power fingers 83, which may be done by changing the concentration of a doping gas during growth or by changing the carbon isotopes in the carbon source during growth such that the length of the mean free path of the ballistic channels in the MWCNTs increases from the end attached to the ground finger to the end attached to the power fingers, resulting in an increased probability of electrons moving toward the power fingers actually exiting through the diodes into the respective power fingers and a corresponding reduced probability of electrons moving back toward the ground finger actually getting to the ground finger, which would correspondingly increase the efficiency of the MWCNT antennas.

Figure 9:
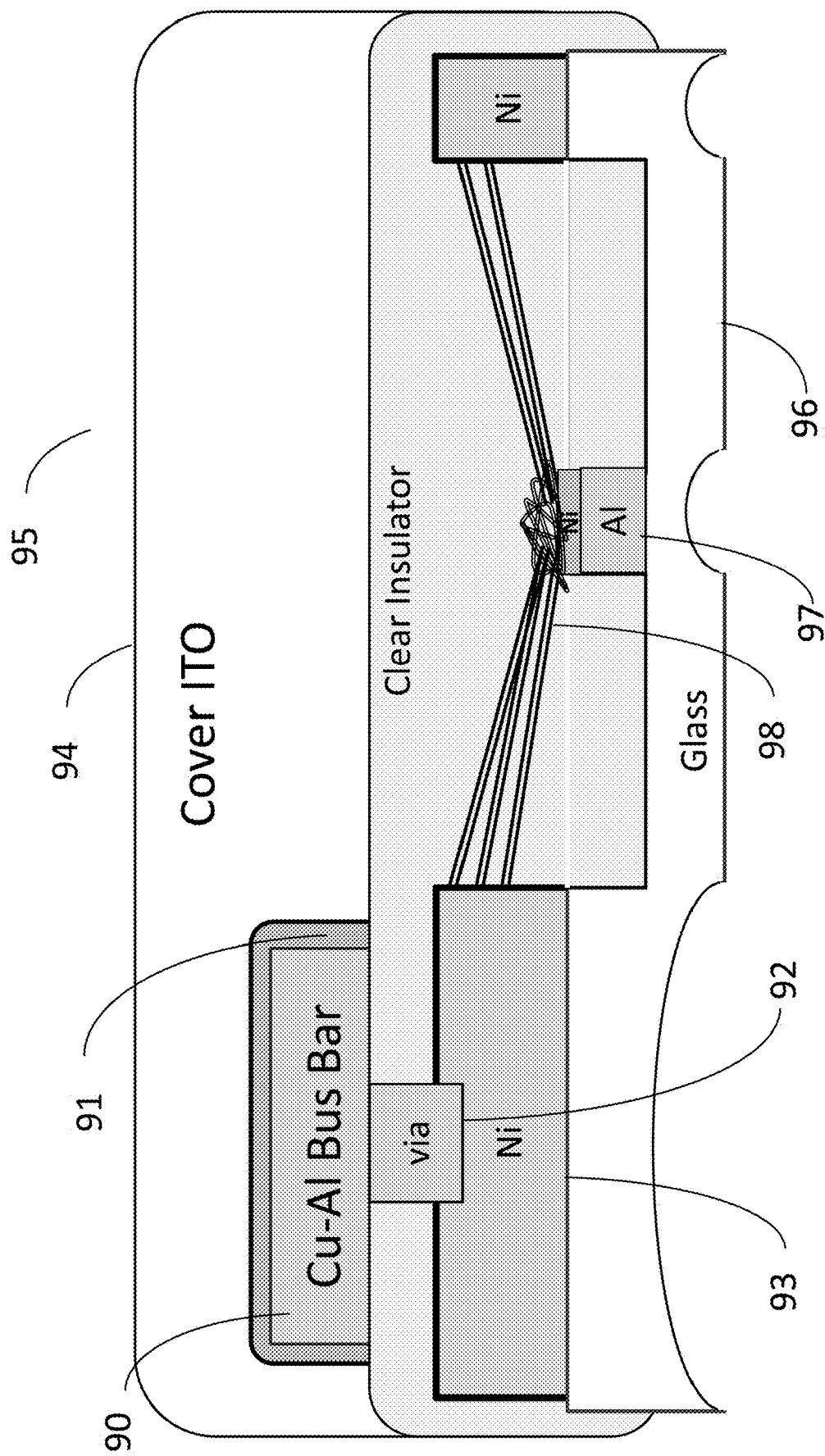
FIG. 9 through FIG. 11 are conceptual diagrams of cross-sections of an antenna array after final processing, according to aspects of the present disclosure.

Reference is now made to FIG. 9, a diagram of a cross-section of an example of an antenna array after final processing. In this case the antenna array 95 may act as a window. It may contain a wide power finger 93 connected by a via 92 to a bus bar 90 that may be set to a –V voltage. The bus bar 90 may be insulated 91 from a grounded clear conductive cover material 94, such as indium tin oxide (ITO), in a way that acts as a window where light can be transmitted through the glass 96 and the clear cover material 94. Furthermore, if the ground fingers 97 are disconnected from the power fingers 93, then the antennas 98 may not absorb the light and the window may thus transmit most of the light into the building in which it is installed; but if the ground fingers are connected with a load to the power fingers 93, the antennas 98 may absorb most of the light, and the windows may appear dark.

It is further contemplated that the amount of light transmitted into the building may be controlled by controlling the amount of light being converted to power by the antennas in such a way that the temperature in the building may be controlled by balancing the amount of light used to power the building's air conditioning versus the amount of light transmitted through the windows used to heat the building.

Figure 10:
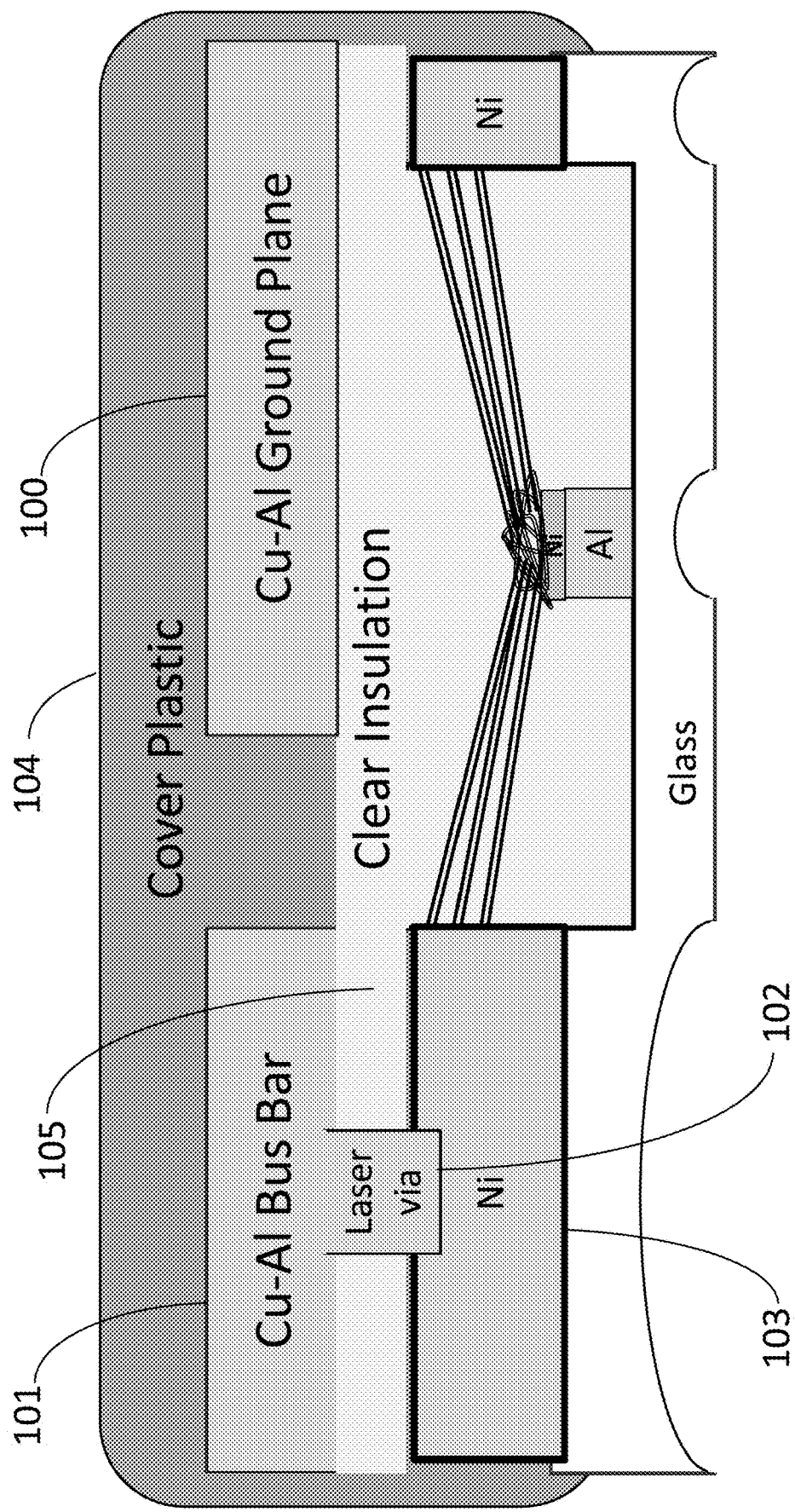

Reference is now made to FIG. 10, a diagram of another cross-section of another example of an antenna array after final processing. In this case the bus bar 101 may be insulated from a similar metal ground plane 100 by an insulation layer 105 and the cover plastic 104. Vias 102 may be etched using a laser, where the vias 102 may connect the nickel negative voltage fingers 103 and the bus bar 101.

Figure 11:
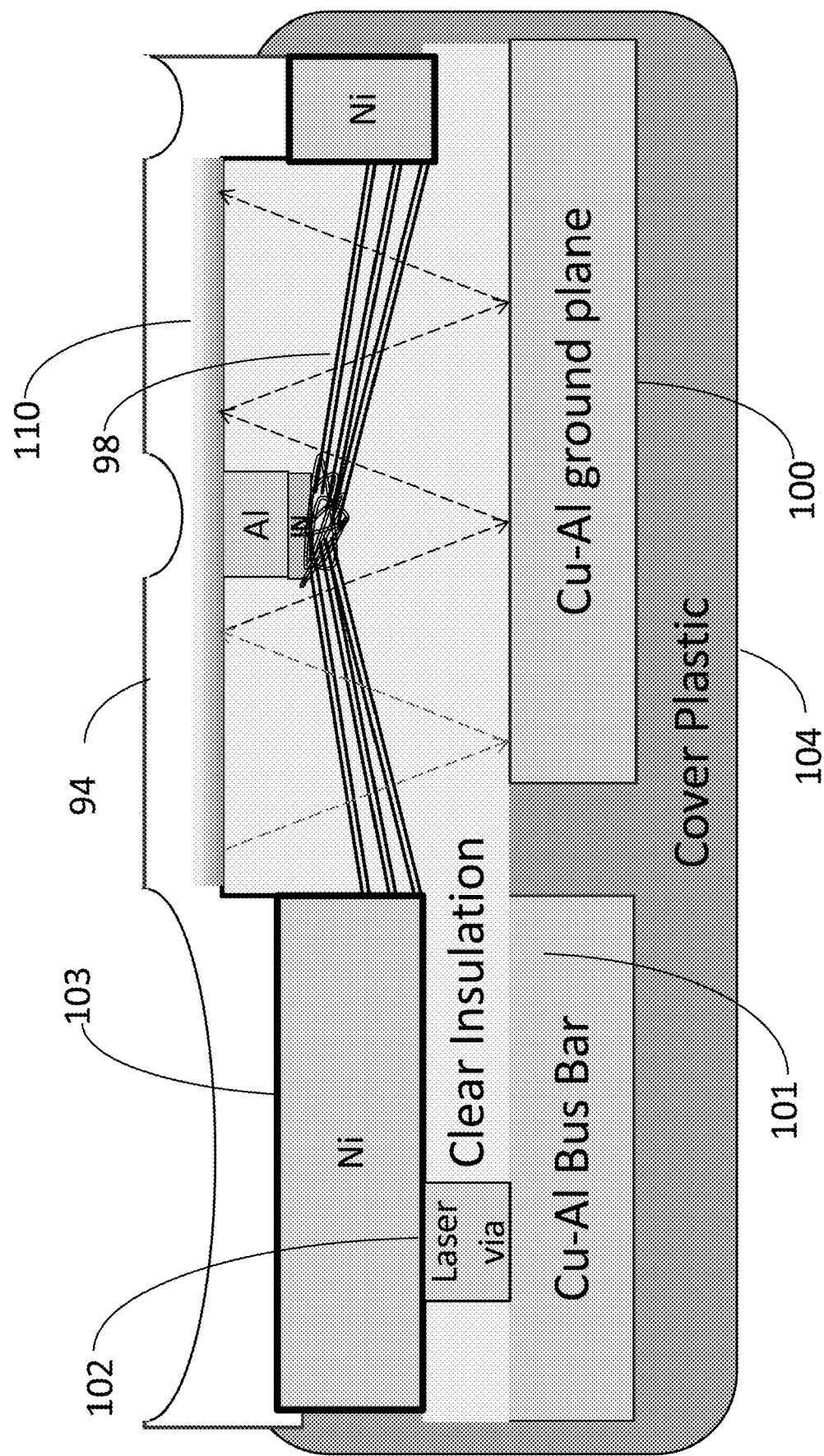

Reference is now made to FIG. 11, yet another diagram of a cross-section of an example of an antenna array after final processing. Multiple layers of glass 110 with different dielectric properties may be layered on the glass 94 such that when combined with the ground plane 100, the light repeatedly reflects off the glass layers 110 and the ground plane 100 in a manner similar to a light pipe, until it is absorbed by antennas 98.

Reference is now made to FIG. 12a through FIG. 12h, example cross-sections of an antenna array during steps to manufacture one version of the array, according to aspects of the present disclosure. In this process, variable depths of resist may be deposited on multiple layers of thin films on a glass substrate, where the resist may be exposed either by variable exposure using lasers or with multiple frequencies of light shining through a single mask containing multiple ¼-wavelength patterns for the frequencies, and processing steps may be performed such that errors due to multiple alignments may be avoided. The mask may be stepped once across the entire surface area being processed with multiple exposures on each step. The resist may be composed of multiple resists, each of which may be sensitive to a different frequency of light. Additionally, the laser may also use multiple frequencies of light. The process may then consist of multiple etching steps, including using some of the thin films as additional masks. Following the formation of MWCNT antennas between the ground lines and the negative voltage lines, a combination of clear low-k and high-k dielectric insulators may be deposited to reduce the parallel capacitance across the antennas while increasing the capacitance between the negative voltage lines and an added ground plane.

Figure 12A:
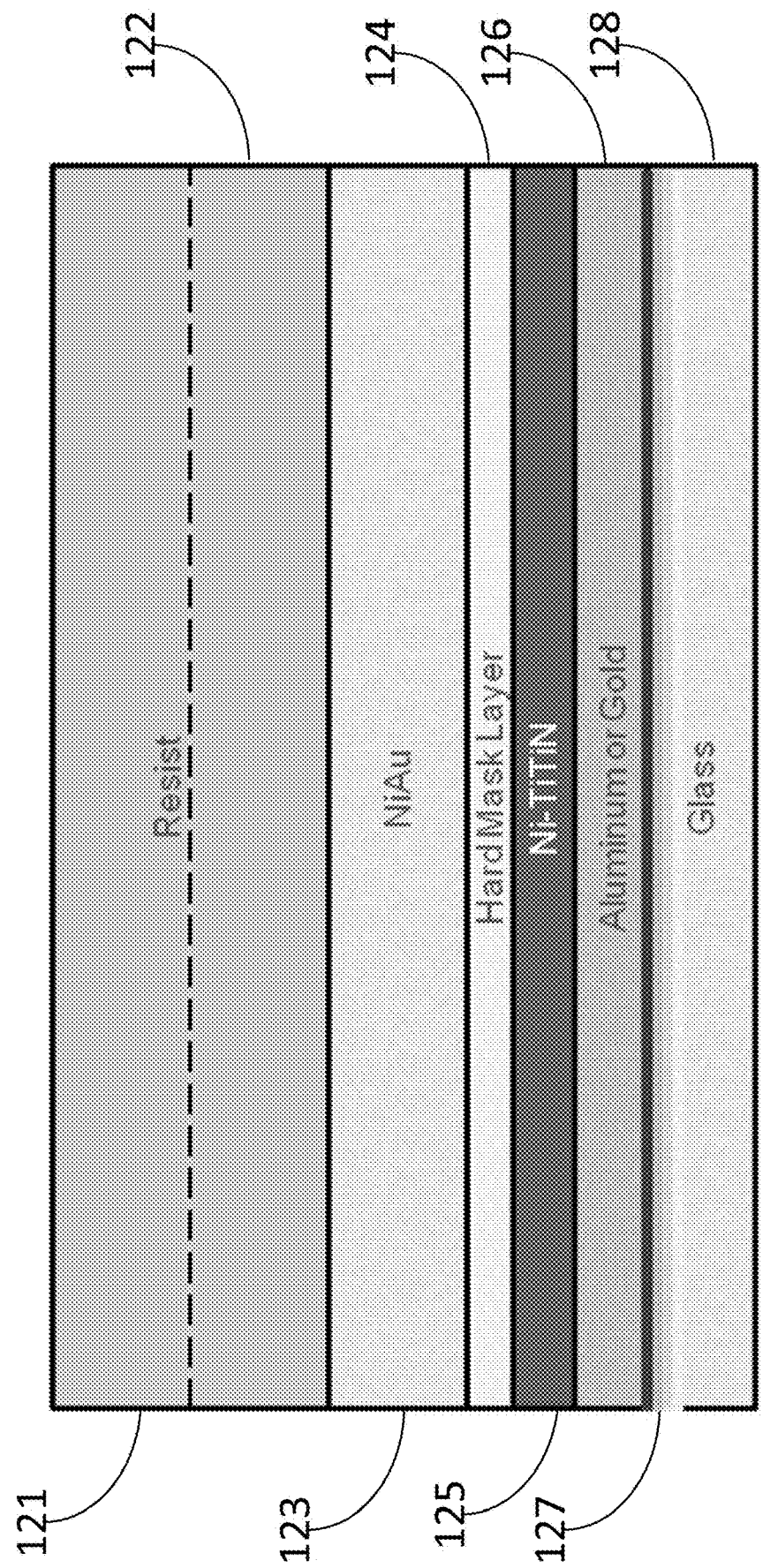
FIG. 12a through FIG. 12h are conceptual cross-sections of an antenna array during steps to manufacture one version of the array, according to various aspects of the present disclosure.

Reference is now made to FIG. 12a, a cross section of an example of a stack of thin film layers consisting of two types of resist 121 and 122 on top of layers of Al or Au 126, Ni—TiTiN 125, a hard mask layer 124, and an NiAu layer 123 on a glass substrate 128 with multiple thin layers of dielectrically different glass 127.

Figure 12B:
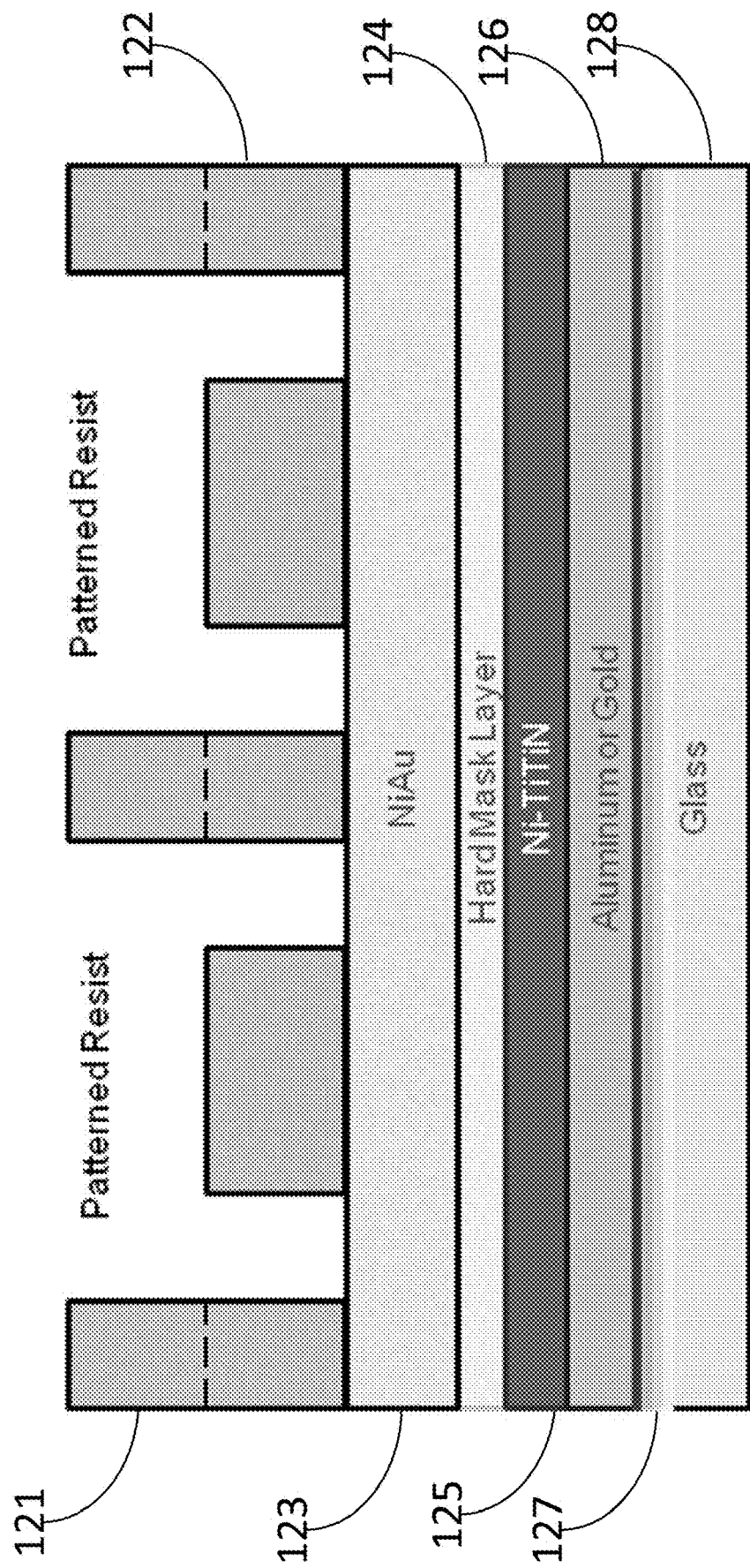
Figure 12C:
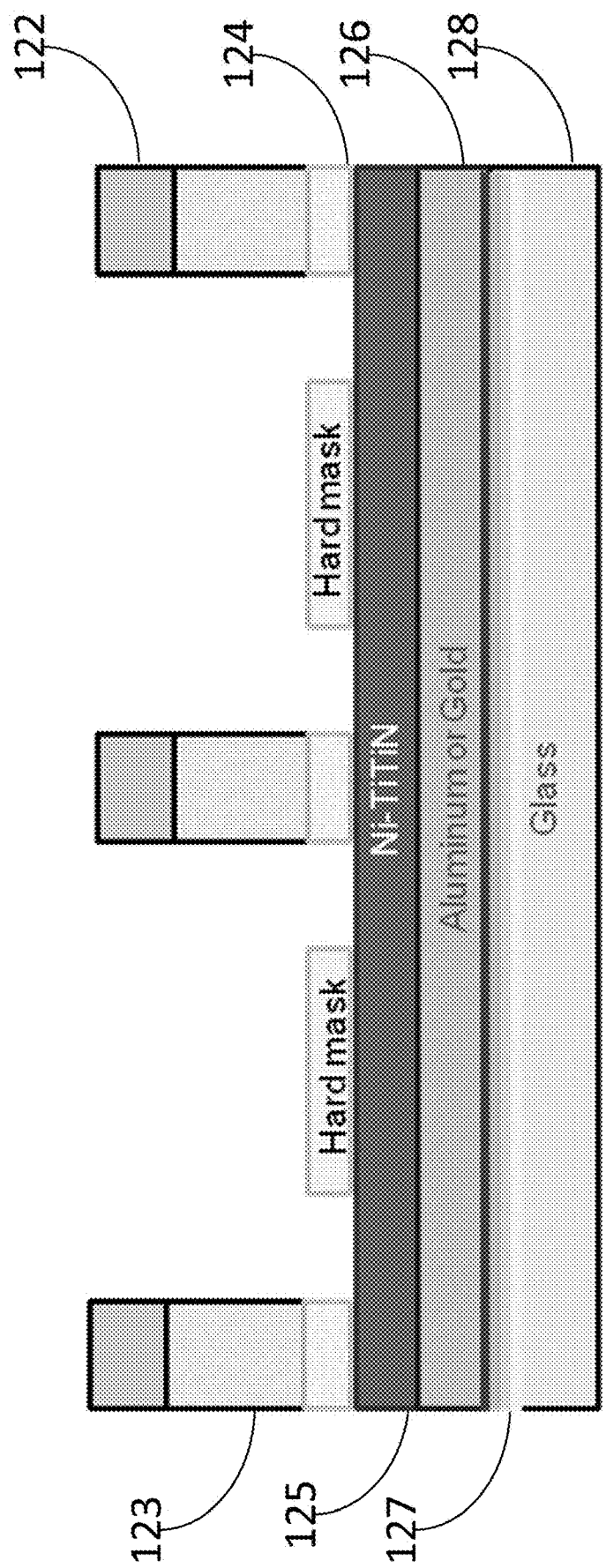

Reference is now made to FIGS. 12b and 12c, where the two layers of resist 121 and 122 were each exposed with a different pattern, followed by etching of the NiAu layer 123 and the hard mask layer 124 with an etch stop on the Ni—TiTiN layer 125.

Figure 12D:
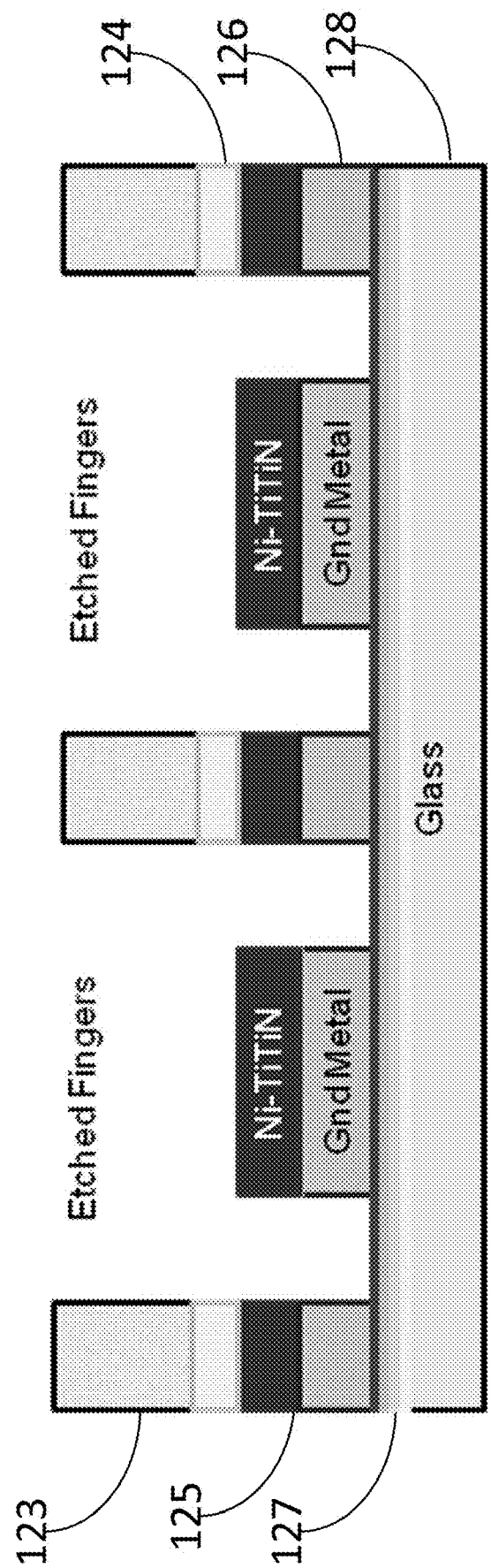
Figure 12E:
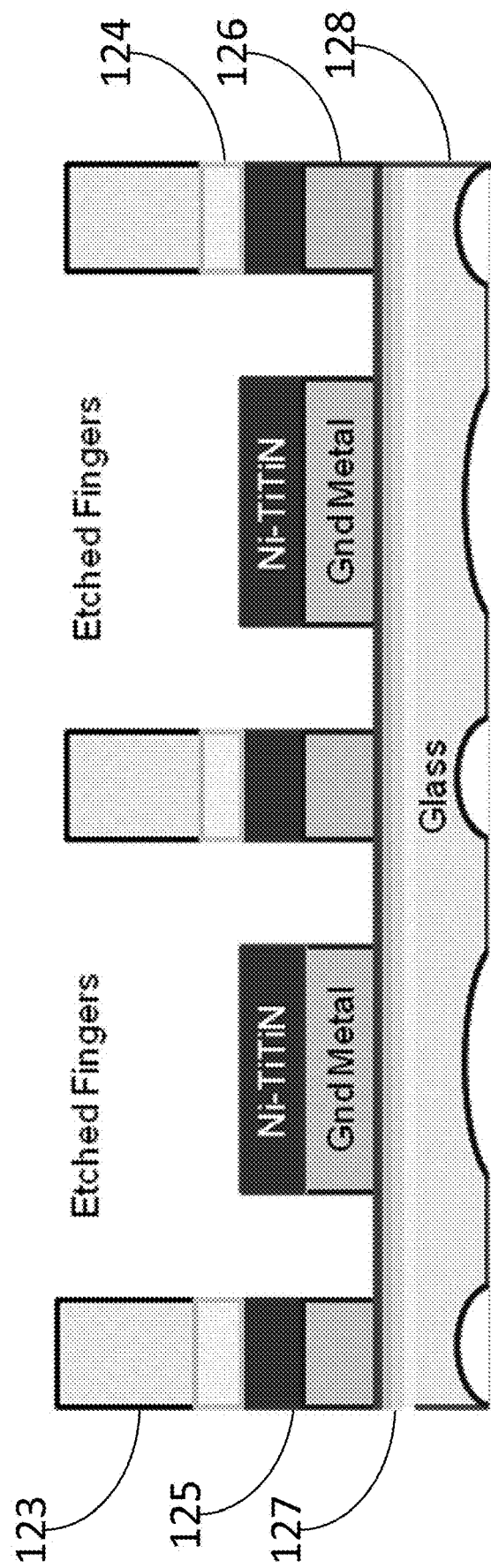

Reference is now made to FIGS. 12d and 12e, where the remaining resist 122 and hard mask layer 124 may be used to pattern the etch through the Ni—TiTiN 125 and Gnd Metal 126 layers down to the glass 127 and 128, which may be followed by depositing a negative resist on the back of the glass, which may be patterned through the top and subsequently etched through the glass to form lenses, as shown in FIG. 12e.

Figure 12F:
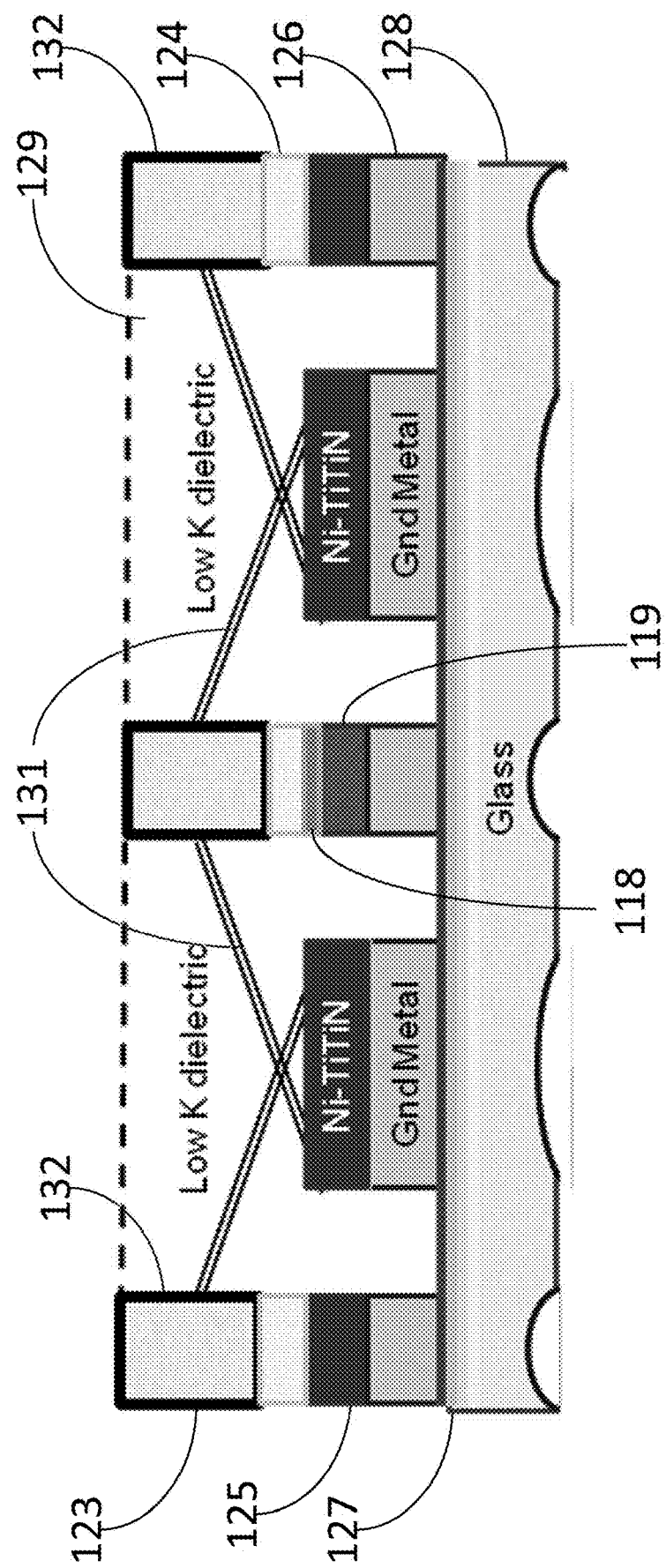
Figure 12G:
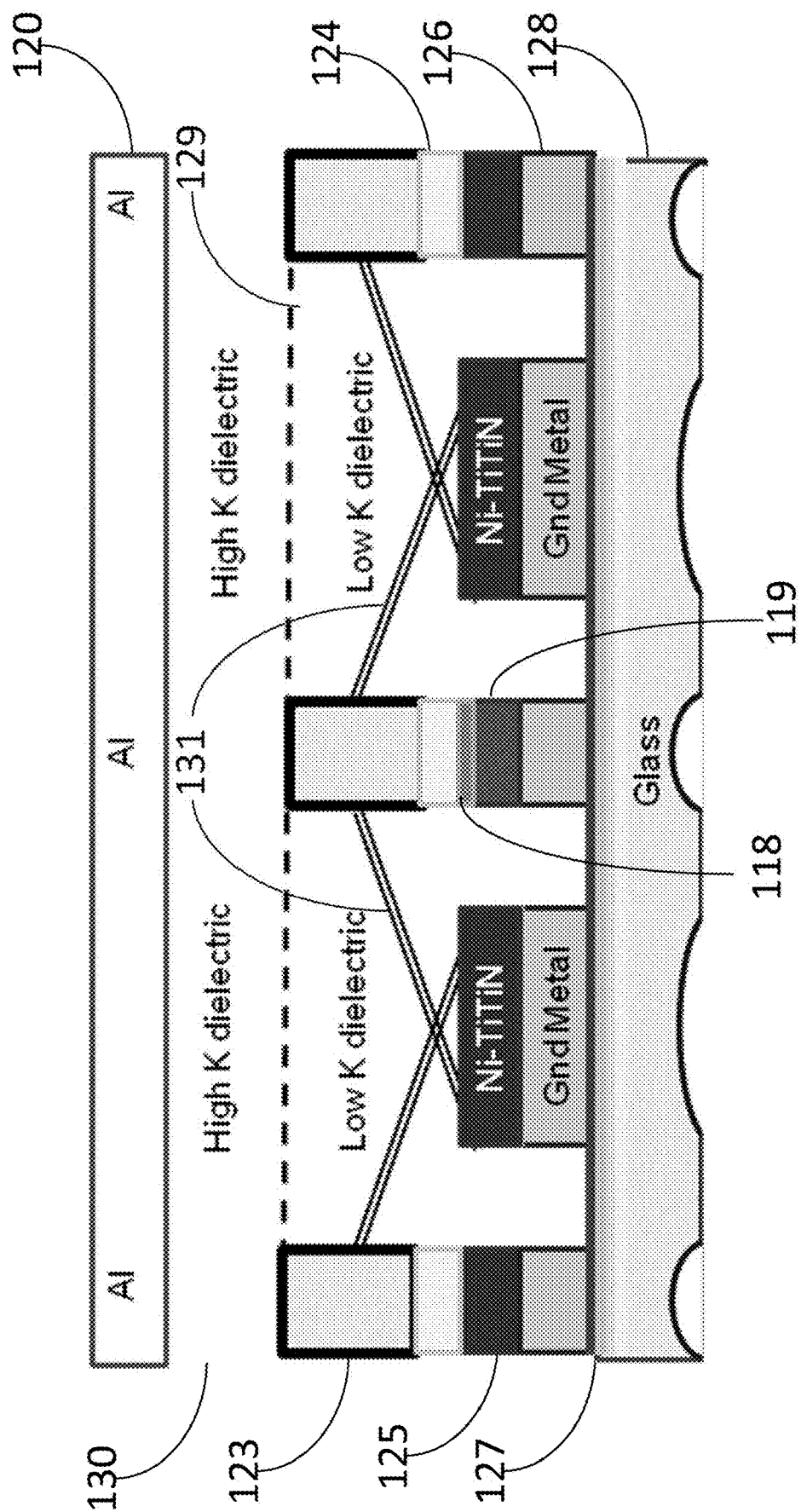

Reference is now made to FIG. 12f and FIG. 12g, where the Ni—TiTiN 125 layer may consist of a thin layer of nickel 118 which may be annealed on the thicker layer of TiTiN 119. Multi-walled carbon nanotubes 131 (MWCNTs) may then be grown from the Ni—TiTiN 125 layer to the NiAu layer 123. The thin layer of nickel may first be annealed to control the location of the nickel at the base the MWCNTs and control the diameters of the MWCNTs by allowing the smaller annealed nickel particles to sink into the TiTiN leaving the larger particles stuck to the TiTiN surface. The MWCNTs may be grown from the annealed nickel particles at the same time as the graphene 132 may be grown on the surface of the NiAu layer hereby allowing the tips of the MWCNTs to bond with the graphene. Alternatively, the graphene may be grown first using lower flows of hydrocarbon gas at a lower partial pressure than the flow and pressure of the hydrocarbon gas during the MWCNT growth. The graphene-MWCNT may have two advantages: it may have no bandgap because it is a carbon-to-carbon connection, and it may form a very low resistance connection because both MWCNTs and graphene have ballistic channels with long mean free paths of no resistance. A low-k dielectric insulator 129 may then be deposited on the MWCNTs and polished down to the top of the NiAu layer 123, which may be followed by a high-k dielectric insulator 130, which may be deposited on the low-k dielectric insulator, and by an aluminum ground plane 120 that may be deposited, patterned, and etched to cover the NiAu layer 123. The NiAu layer 123 may be patterned to form the negative voltage lines, while the Ni—TiTiN layer may be patterned to form the ground lines. The low-k dielectric, which may be composed, for example, of amorphous boron nitride, may minimize the coupling capacitance between the negative voltage and the ground lines, while the high-k dielectric between the ground plane and the negative voltage fingers, may form a decoupling capacitor that may smooth the AC ripple in the negative voltage lines.

Figure 12H:
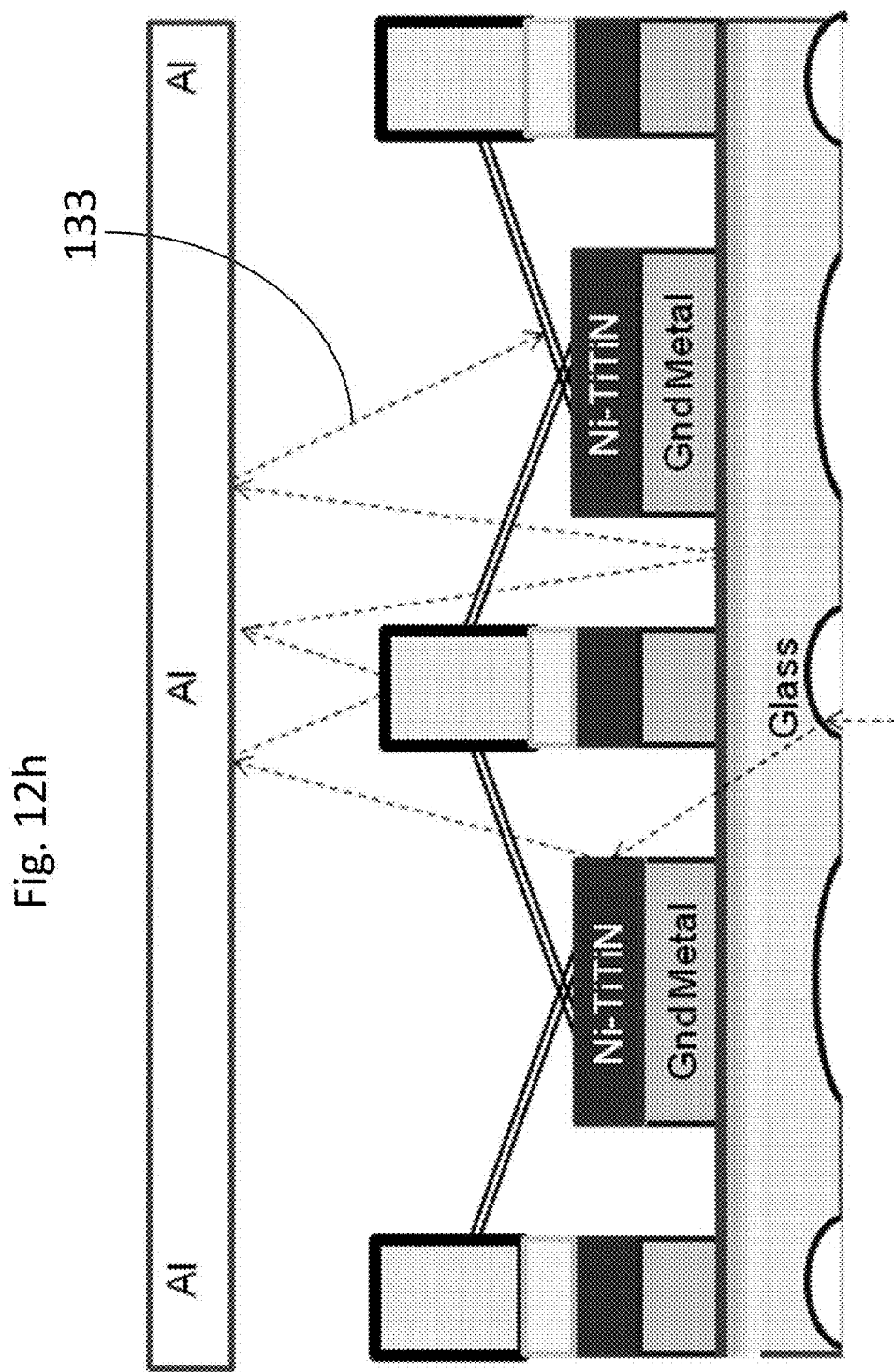

Reference is now made to FIG. 12h, where a path of an exemplary photon 133 is shown entering the glass reflecting off the ground plane and internal glass surface to finally being absorbed by a MWCNT. First, the glass lens may direct the light around the negative voltage and ground lines. Then, the light may reflect off the voltage and/or ground lines and/or ground plane, which may occur repeatedly, in a manner similar to a light pipe, until it is absorbed by a MWCNT.

Figure 12I:
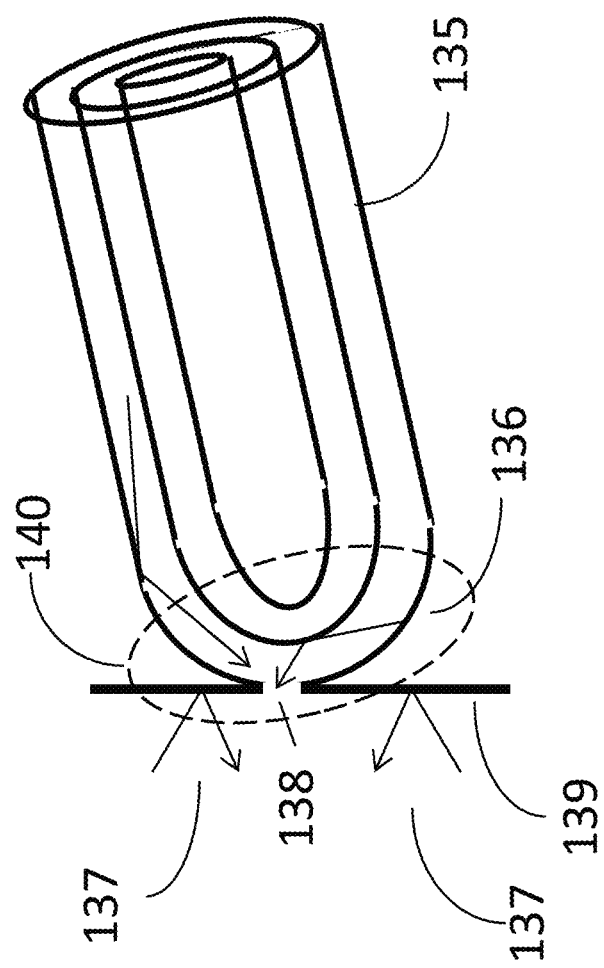
FIG. 12i is an enlarged view of the tip of a carbon nanotube antenna, its associated geometric diode, and its connection to a negative voltage finger, according to various aspects of the present disclosure.

Reference is now made to FIG. 12i, and example of an enlarged view of the tip of a carbon nanotube antenna, its associated geometric diode, and its connection to a negative voltage finger. The absorbed photon discussed above may either be retransmitted, continuing its reflective path to again be reabsorbed, or may drive an electron 136 through the geometric diode 140 at the end of the MWCNT 135, which may thereby significantly increase the amount of light being converted into electricity. The geometric diode 140 may connect to the nickel negative voltage finger 139 at a small opening 138 such that the electrons in the MWCNT may easily be funneled to the negative voltage finger, but the small size of the opening 138 may limit the electrons 137 in the nickel negative voltage finger 139 from returning to the MWCNT, thus forming an electrical diode due to its geometric shape.

Figure 13:
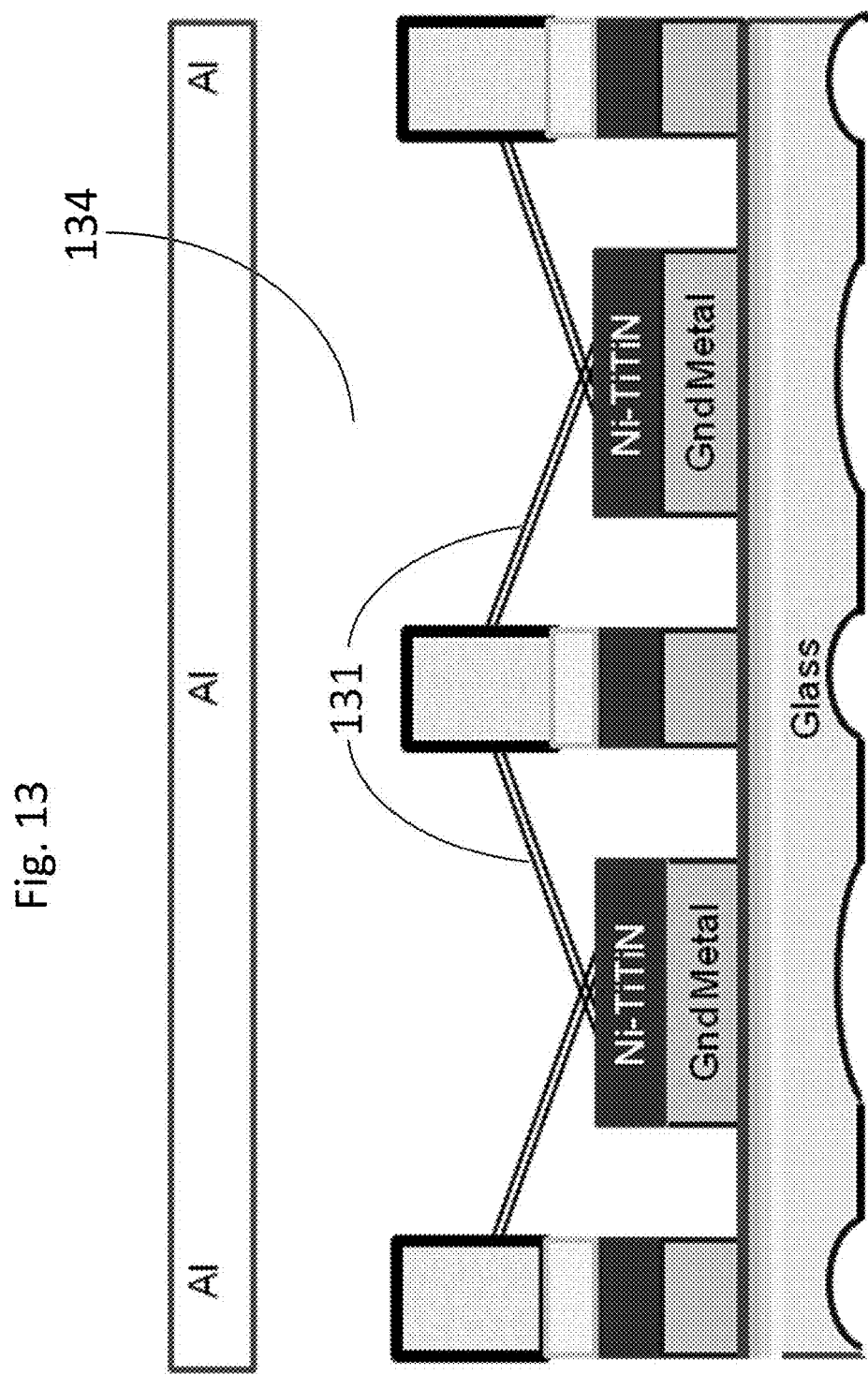
FIG. 13 is a diagram of yet another conceptual cross-section of an antenna array after final processing, according to aspects of the present disclosure.

Reference is now made to FIG. 13, which is an example diagram of yet another cross-section of an antenna array after final processing. In this process, an inert gas may be injected between the glass and added ground plane 134, with both the negative voltage and ground lines biased to negative voltages to allow vibration of the MWCNT antennas induced by thermal Brownian motion of the gas hitting the MWCNTs to be rectified into additional power.

It will be appreciated by persons skilled in the art that the present invention is not limited by what has been particularly shown and described hereinabove. Rather the scope of the present invention includes both combinations and subcombinations of various features described hereinabove as well as modifications and variations which would occur to persons skilled in the art upon reading the foregoing description and which are not in the prior art.

We claim:

1. An apparatus including:
   an array of multi-walled carbon nanotube (MWCNT) antennas;
   an array of geometric diodes, wherein the MWCNT antennas are connected between interdigitated ground lines and negative voltage lines through the array of geometric diodes;
   a low-k dielectric insulator deposited on the MWCNTs; and
   a high-k dielectric insulator deposited on top of the low-k dielectric insulator.

2. The apparatus as in claim 1, further including a conductive ground plane deposited on top of the high-k dielectric insulator.

3. The apparatus as in claim 1, wherein the low-k dielectric insulator is amorphic boron nitride.

4. The apparatus as in claim 1, wherein the low-k dielectric insulator minimizes a coupling capacitance between the ground and negative voltage lines.

5. The apparatus as in claim 2, wherein the high-k dielectric insulator forms a decoupling capacitor between the negative voltage lines and the conductive ground plane that serves to smooth AC ripple in the negative voltage lines.

* * * * *